United States Patent
Araki

(10) Patent No.: US 7,745,076 B2
(45) Date of Patent: Jun. 29, 2010

(54) DYE-CONTAINING CURABLE COMPOSITION, COLOR FILTER, AND PRODUCING PROCESS THEREOF

(75) Inventor: Katsumi Araki, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 145 days.

(21) Appl. No.: 11/965,931

(22) Filed: Dec. 28, 2007

(65) Prior Publication Data

US 2008/0176151 A1 Jul. 24, 2008

Related U.S. Application Data

(62) Division of application No. 10/455,413, filed on Jun. 6, 2003, now Pat. No. 7,358,033.

(30) Foreign Application Priority Data

Jun. 7, 2002 (JP) ............... 2002-166993
Jun. 27, 2002 (JP) ............... 2002-187670

(51) Int. Cl.
*G02B 5/20* (2006.01)

(52) U.S. Cl. .......................................... 430/7

(58) Field of Classification Search .................. None
See application file for complete search history.

(56) References Cited

U.S. PATENT DOCUMENTS

| 5,153,095 | A | 10/1992 | Kawamura et al. |
| 6,197,480 | B1 | 3/2001 | Iguchi et al. |
| 6,746,820 | B2 | 6/2004 | Furukawa |
| 6,916,595 | B2 | 7/2005 | Fujimaki et al. |
| 2001/0018164 | A1 | 8/2001 | Furukawa |

| 2003/0146965 | A1 | 8/2003 | Fujimaki et al. |

FOREIGN PATENT DOCUMENTS

| JP | 6-75375 A | 3/1994 |
| JP | 7-045120 A | 2/1995 |
| JP | 7-135386 A | 5/1995 |
| JP | 8-227153 A | 9/1996 |
| JP | 9-95617 A | 4/1997 |
| JP | 10-020496 | * 1/1998 |
| JP | 10-68812 A | 3/1998 |
| JP | 2001-133966 A | 5/2001 |

OTHER PUBLICATIONS

Computer-generated transaltion of JP 10-020496 (Jan. 1998).*
Kirk-Othmer Enc. of Chemical Techn., vol. 9, pp. 238-249, c 2001.
Japanese Office Action dated Sep. 25, 2007.
Japanese Office Action dated Dec. 18, 2007.

* cited by examiner

*Primary Examiner*—John A. McPherson
(74) *Attorney, Agent, or Firm*—Sughrue Mion, PLLC

(57) ABSTRACT

A dye-containing curable composition including a binder and a dye that is soluble in an organic solvent, in which the binder contains a structural unit represented by the following general formula (I) and has a glass transition temperature in a range of 0 to 250° C. In general formula (I), $R^1$ represents a hydrogen atom or a methyl group; $R^2$ represents an oxygen atom, —NH—, or —N($R^3$—$R^4$)—; $R^3$ represents a substituted or unsubstituted divalent group; and $R^4$ represents a group containing an unsaturated double bond.

General formula (I)

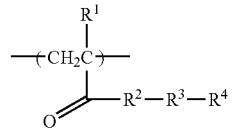

8 Claims, No Drawings

DYE-CONTAINING CURABLE COMPOSITION, COLOR FILTER, AND PRODUCING PROCESS THEREOF

This is a divisional of application Ser. No. 10/455,413 filed Jun. 6, 2003, now U.S. Pat. No. 7,358,033. The entire disclosure of the prior application, application Ser. No. 10/455,413, is hereby incorporated by reference.

CROSS-REFERENCE TO RELATED APPLICATION

This application claims priority under 35 USC 119 from Japanese Patent Application Nos. 2002-166993 and 2002-187670, the disclosure of which is incorporated by reference herein.

BACKGROUND OF THE INVENTION

1. Field of the Invention

The present invention relates to a dye-containing curable composition suitable for forming a colored image, which constitutes a color filter used in liquid crystal display devices (LCD) or solid image pickup devices (CCD, CMOS, etc.), as well as a color filter using the dye-containing curable composition, and a process of producing the same.

2. Description of the Related Art

As for processes for producing color filters using a photoresist, the followings have long been known: staining technique comprising pattern formation with a photoresist, followed by pattern staining; electrodeposition comprising formation of a pre-patterned transparent electrode and subsequent pattern formation by ionization of a resin containing pigment dissolved/dispersed in a solvent by voltage application; printing method by offset printing with ink containing thermosetting resin or ultraviolet-curing resin; and pigment dispersing method using a color-resist agent in which a coloring agent such as pigment is dispersed in a photoresist material. Recently major method is the pigment-dispersing method.

Among these processes, in the pigment-dispersing process, a color filter is made by photolithography using a colored radiosensitive composition in which a pigment is dispersed in a variety of photosensitive compositions; this method is advantageous because a pigment used is stable to light or heat. In addition, since the patterning is made by photolithography, highly precise positioning is allowed, and thus the method has widely been utilized as a preferred method in producing a color filter for use in a large-sized and highly fine color display.

Specifically, a colored radiosensitive composition is applied on a substrate by a spin coater or roll coater, and dried to form a film, on which pattern exposure is made and developed to generate colored pixels. This operation is repeated plural times according to the number of hue to give a color filter. For example, these processes are described in JP-A Nos. 1-102469, 1-152499, 2-181704, 2-199403, 4-76062, 5-273411, 6-184482, and 7-140654.

In recent years, the application of color filters has been expanded from liquid crystal display devices (LCD) to solid image pickup devices such as CCDs. In the solid image pickup devices, the pixels tend to become very fine with high density of pickup image, and accordingly it is essential to further reduce the particle size of organic pigment used as a coloring agent for a color filter in the pigment-dispersing method. There is a limitation, however, in the primary particle size of the organic pigment. In order to solve such a problem, it has been attempted to use a dye-type curable composition by incorporating a dye as a coloring agent in the medium of the curable composition in a dissolved state. The method has been described for example in JP-A No. 6-75375.

In recent years, however, much finer particles have been required for the color filter for use in a solid image pickup device, because the so far used pigment dispersion is insufficient to improve the resolution of image and sometimes generates uneven color due to rough particles of the pigment. Thus, the pigment dispersion type was not suitable for the application in the solid image pickup device which requires a color filter having a fine pattern.

In order to solve this problem, the use of dyes has so far been proposed, for example, as described in JP-A No. 6-75375. The curable compositions containing dyes, however, give rise to other problems. That is:

(1) Since conventional pigments are low in solubility in either an alkaline aqueous solution or an organic solvent, it is difficult to obtain a liquid curable composition having a desired spectrum.

(2) Since most of dyes interact with another component contained in the curable composition, it is difficult to adjust the solubility of the curing portion and the non-curing portion (developing properties).

(3) When the molar absorption coefficient ($\epsilon$) is low, a large amount of dye has to be added, and in such a case other components contained in the curable composition such as a polymerizing compound (monomer), binder, photo-polymerization initiator, and so on have to be reduced; this causes further problems, i.e., decrease of curing power, thermal resistance after curing, and developing properties in the (non) curing portion.

(4) Dyes are in general inferior to pigments in light resistance and thermal resistance.

In addition, when the composition is used in production of color filters for use in a solid image pickup device, the film thickness is required to be in 1.5 μm or thinner particularly differing from the case of using in the production of semiconductors. Therefore, it is necessary to add a large amount of pigment into a curable composition in order to obtain the desired color concentration, resulting in causing the above-mentioned problems.

Because of these problems, it was difficult to satisfy the practically required performance concerning a fine and coloring pattern for a highly fine color filter.

On the other hand, JP-A No. 10-68812 discloses a photosensitive coloring composition in which is used a ternary or multi-element binder containing a monomer having a side chain (meth)acryloyl group, a monomer having an alcoholic hydroxyl group, and a monomer having a carboxylic acid group. This composition, however, has been designed on the assumption that it is applied to the case of using pigments, but there is no description in using dyes soluble in an organic solvent. Moreover, as the ternary or multi-element polymer contains an alcoholic hydroxyl group, it decreases Tg (glass transition temperature) and melt viscosity of the polymer causing a trouble in thermal resistance during patterning. Further improvement is desired, accordingly.

SUMMARY OF THE INVENTION

The purpose of the present invention is to provide a highly productive dye-containing curable composition which has high sensitivity, high resolving power, high thermal resistance and broad developing latitude with no elution of the dye, as well as to provide a color filter using it, and a process for production thereof.

The above-mentioned problems can be resolved by the following specific measures.

The first embodiment of the invention provides a dye-containing curable composition comprising a binder and a dye that is soluble in an organic solvent wherein the binder contains a structural unit represented by the following general formula (I) and has a glass transition temperature in the range of 0 to 250° C.

General formula (I)

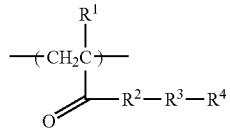

In the general formula (I), $R^1$ represents a hydrogen atom or a methyl group; $R^2$ represents an oxygen atom, —NH—, or —N($R^3$—$R^4$)—; $R^3$ represents a substituted or unsubstituted divalent group; and $R^4$ represents a group containing an unsaturated double bond.

The second embodiment of the invention provides a dye-containing curable composition comprising a binder and a dye wherein the binder is a compound represented by the following general formula (II).

General formula (II)

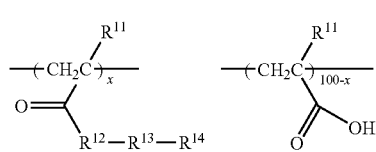

In the general formula (II), $R^{11}$ represents a hydrogen atom or methyl; and $R^{12}$ represents an oxygen atom, —NH—, or —N($R^{13}$—$R^{14}$)—. $R^{13}$ represents a substituted or unsubstituted divalent group; and $R^{14}$ represents a group containing an unsaturated double bond. The symbol x indicates a molar fraction of a copolymerizing constituent unit and represents a value that satisfies $0 \leq x \leq 100$.

The present invention also provides a color filter including the dye-containing curable composition and a producing process of the color filter.

DETAILED DESCRIPTION OF THE INVENTION

The followings will describe in detail the dye-containing curable composition of the present invention, as well as a color filter containing the dye-containing curable composition and a process of producing the color filter.

<Dye-containing Curable Composition>

The dye-containing curable composition in the first embodiment of the invention is characterized in that it contains a binder and a dye that is soluble in an organic solvent, wherein the binder has a structural unit represented by the general formula (I) indicated in the following item of Binder and its glass transition temperature is in the range of 0 to 250° C.

The dye-containing curable composition in the second embodiment of the invention is characterized in that it contains a binder and a dye, wherein the binder is a compound represented by the general formula (II) indicated in the following item of Binder.

In addition, the dye-containing curable composition of the invention may contain, in addition to the binder and dye, an o-naphthoquinone diazide compound when it is formed into a positive type or a monomer or oligomer having at least one additional ethylenic unsaturation and a photopolymerization initiator when it is formed into a negative type. If required, it may further contain another component such as cross-linking agent. In the case of forming into the positive type, the monomer or oligomer and photopolymerization initiator may further be contained therein.

—Binder—

The binder used in the first embodiment of the invention contains a structural unit represented by the following general formula (I) and its glass transition temperature is in the range of 0 to 250° C. The binder of the invention is a copolymer having a polymerizing side chain. The dye-containing curable composition obtained in the invention by using the binder of the invention is superior to the so far known ones in a developing properties in the unexposed parts, the film residual rate in the exposed parts, and thermal resistance of the patterned shape.

The structural unit represented by the following general formula (I) will be described as follows.

General formula (I)

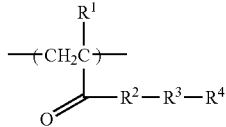

In the general formula (I), $R^1$ represents a hydrogen atom or a methyl group. These may be selected in consideration of the strength of film, elastic modulus, viscoelasticity, thermal resistance, developing properties, Tg of polymers, solubility, synthetic applicability, and so on.

In the general formula (I), $R^2$ represents an oxygen atom, —NH—, or —N($R^3$—$R^4$)—. These may also be selected in consideration of the strength of film, elastic modulus, viscoelasticity, thermal resistance, developing properties, synthetic applicability, Tg of polymers, solubility, and so on.

In the general formula (I), $R^3$ represents a substituted or unsubstituted divalent group. The $R^3$ is preferably selected from a substituted or unsubstituted divalent alkylene group having 1 to 30 carbons, a substituted or unsubstituted divalent alkyleneoxy group having 1 to 30 carbons and a substituted or unsubstituted divalent ethyloxycarbonylaminoethyl having 1 to 30 carbons.

The divalent group represented by the above-mentioned $R^3$ is preferably a divalent alkylene group, alkyleneoxy group or ethyloxycarbonylaminoethyl having 1 to 25 carbons, more preferably a divalent alkylene group, alkyleneoxy group or ethyloxycarbonylaminoethyl having 1 to 20 carbons, and particularly preferred are methylene, ethylene, propylene, butylene, ethyleneoxy, diethyleneoxy, triethyleneoxy, and ethyloxycarbonylaminoethyl. These groups may be substituted.

The substituent of $R^3$ includes alkyl groups having 1 to 20 carbons, especially those having 1 to 15 carbons, more preferably those having 1 to 10 carbons, particularly those having 1 to 7 carbons.

Most preferred specific examples of the above-mentioned substituents, in consideration of the starting materials and synthetic applicability, include methyl, ethyl, straight or branched propyl, butyl, pentyl, and hexyl.

However, the alcoholic hydroxyl group is excluded from the preferred examples because it may decrease Tg in some instances.

$R^4$ represents a group having an unsaturated double bond, specifically including vinyloxy, allyloxy, (meth)acryloyloxy, 4-vinylphenyloxy, 4-vinylphenylmethyloxy, vinyl ester, and the like. Especially, vinyloxy, allyloxy, (meth)acryloyloxy, 4-vinylphenylmethyloxy, and vinyl ester are preferred as $R^4$. Particularly, allyloxy, (meth)acryloyloxy and 4-vinylphenylmethyloxy are preferred.

Tg of the binder containing a structural unit represented by the general formula (I) in the invention can be adjusted by utilizing the binder's molecular weight, molecular structure, and hydrogen bond interaction, and may be determined in consideration of the Tg of the simultaneously used binder, affinity of the simultaneously used binder with other components, and viscoelasticity of the entire system. Too low Tg of the binder makes the thermal resistance of the formed pattern decrease to have a trouble of heat flow. It makes further the adhesiveness of the coated film increase to have a trouble of decrease of workability. In view of this point, it is not preferable to incorporate an alcoholic hydroxyl group in the binder. In addition, since the alcoholic hydroxyl group has relatively weak hydrogen bond interaction, no sufficient effect is expected in most cases.

The Tg of the binder in the invention is preferably in the range of 20 to 250° C., more preferably 30 to 250° C., and most preferably 40 to 250° C. The binder of the invention may be used in combination with another binder. The other binder will be described below.

The molar fraction of the structural unit represented by the general formula (I) contained in the binder of the invention is preferably in 5 to 95 mol %, more preferably 10 to 90 mol %, and most preferably 15 to 85 mol %.

The molecular weight of the binder in the invention is preferably in 500 to 10,000,000 Da (Dalton: unit of molecular weight) as weight-average molecular weight, more preferably 1,000 to 5,000,000 Da, and most preferably 2,000 to 5,000,000 Da.

There is no limitation in the component (so-called copolymer component) constituting the binder of the invention together with the structural unit represented by the general formula (I), as far as it allows (binary or more) copolymerization. The examples of the above-mentioned copolymerization components include, as described in JP-A No. 59-44615, JP-B Nos. 54-34327, 58-12577 and 54-25957, JP-A Nos. 59-53836 and 59-71048, methacrylic acid copolymer, acrylic acid copolymer, itaconic acid copolymer, crotonic acid copolymer, maleic acid (anhydride) copolymer, partially esterified maleic acid copolymer, monomer used in partially amidated maleic acid copolymer, (meth)acrylates, (meth)acrylamides, vinyl-containing aromatic hydrocarbon rings, vinyl-containing heteroaromatic rings, maleic anhydride, itaconic acid ester, crotonic acid ester, (meth)acrylonitrile, (metha)crotononitrile, a variety of styrenes, a variety of benzoyloxyethylenes, a variety of acetoxyethylenes, vinylcarbazoles, vinylpyrrolidone, and the like.

In particular, the above-mentioned copolymer component preferably include: (meth)acrylic acid, substituted or unsubstituted $C_1$-$C_{25}$ (cyclo)alkyl (meth)acrylates, (meth)acrylates having (an) substituted or unsubstituted $C_1$-$C_{25}$ bicyclo ring(s), substituted or unsubstituted $C_1$-$C_{25}$ aralkyl (meth)acrylates, substituted or unsubstituted $C_1$-$C_{25}$ aryl (meth)acrylates;
(meth)acrylamide, substituted or unsubstituted $C_1$-$C_{25}$ (cyclo)alkyl secondary or tertiary (meth)acrylamides, secondary or tertiary (meth)acrylamides having (an) substituted or unsubstituted $C_1$-$C_{25}$ bicyclo ring(s), substituted or unsubstituted $C_1$-$C_{25}$ aralkyl secondary or tertiary (meth)acrylamides, substituted or unsubstituted $C_1$-$C_{25}$ aryl secondary or tertiary (meth)acrylamides, substituted or unsubstituted $C_1$-$C_{25}$ (meth) acryloylmorpholines;
vinyl-containing substituted or unsubstituted $C_1$-$C_{25}$ aromatic hydrocarbon rings, vinyl-containing substituted or unsubstituted $C_1$-$C_{25}$ heteroaromatic rings, maleic anhydride, substituted or unsubstituted $C_1$-$C_{25}$ ($\alpha$-methyl-)styrene, vinylimidazole, vinyltriazole, substituted or unsubstituted $C_1$-$C_{25}$ partially esterified maleic acid copolymers, substituted or unsubstituted $C_1$-$C_{25}$ partially amidated maleic acid, methyl jasmonate;
itaconic acid, substituted or unsubstituted $C_1$-$C_{25}$ (cyclo)alkyl itaconates, itaconates having (an) substituted or unsubstituted $C_1$-$C_{25}$ bicyclo ring(s), substituted or unsubstituted $C_1$-$C_{25}$ aralkyl itaconates, substituted or unsubstituted $C_1$-$C_{25}$ aryl itaconates;
crotonic acid, substituted or unsubstituted $C_1$-$C_{25}$ (cyclo)alkyl crotonates, crotonates having (an) substituted or unsubstituted $C_1$-$C_{25}$ bicyclo ring(s), substituted or unsubstituted $C_1$-$C_{25}$ aralkyl crotonates, substituted or unsubstituted $C_1$-$C_{25}$ aryl crotonates;
substituted or unsubstituted $C_1$-$C_{25}$ benzoyloxyethylenes, substituted or unsubstituted $C_1$-$C_{25}$ acetoxyethylenes, (meth)acrylonitrile, (metha)crotononitrile, substituted or unsubstituted $C_1$-$C_{25}$ vinylcarbazoles, and vinylpyrrolidone.

In particular, the followings are preferred: (meth)acrylic acid, substituted or unsubstituted $C_1$-$C_{20}$ (cyclo)alkyl (meth)acrylates, (meth)acrylates having (an) substituted or unsubstituted $C_1$-$C_{20}$ bicyclo ring(s), substituted or unsubstituted $C_1$-$C_{20}$ aralkyl (meth)acrylates, substituted or unsubstituted $C_1$-$C_{20}$ aryl (meth)acrylates; (meth)acrylamide, substituted or unsubstituted $C_1$-$C_{20}$ (cyclo)alkyl secondary or tertiary (meth)acrylamides, secondary or tertiary (meth)acrylamides having (an) substituted or unsubstituted $C_1$-$C_{20}$ bicyclo ring(s), substituted or unsubstituted $C_1$-$C_{20}$ aralkyl secondary or tertiary (meth)acrylamides, substituted or unsubstituted $C_1$-$C_{20}$ aryl secondary or tertiary (meth)acrylamides, substituted or unsubstituted $C_1$-$C_{20}$ (meth)acryloylmorpholines;
vinyl-containing substituted or unsubstituted $C_1$-$C_{20}$ aromatic hydrocarbon rings, vinyl-containing substituted or unsubstituted $C_1$-$C_{20}$ heteroaromatic rings, maleic anhydride, substituted or unsubstituted $C_1$-$C_{20}$ partially esterified maleic acid copolymers, substituted or unsubstituted $C_1$-$C_{20}$ partially amidated maleic acid, substituted or unsubstituted $C_1$-$C_{20}$ ($\alpha$-methyl-)styrene, methyl jasmonate; itaconic acid, substituted or unsubstituted $C_1$-$C_{20}$ (cyclo)alkyl itaconates, itaconates having (an) substituted or unsubstituted $C_1$-$C_{20}$ bicyclo ring(s), substituted or unsubstituted $C_1$-$C_{20}$ aralkyl itaconates, substituted or unsubstituted $C_1$-$C_{20}$ aryl itaconates;
crotonic acid, substituted or unsubstituted $C_1$-$C_{20}$ (cyclo)alkyl crotonates, crotonates having (an) substituted or unsubstituted $C_1$-$C_{20}$ bicyclo ring(s), substituted or unsubstituted $C_1$-$C_{20}$ aralkyl crotonates, substituted or unsubstituted $C_1$-$C_{20}$ aryl crotonates;
substituted or unsubstituted $C_1$-$C_{20}$ benzoyloxyethylenes, substituted or unsubstituted $C_1$-$C_{20}$ acetoxyethylenes, substituted or unsubstituted $C_1$-$C_{20}$ vinylcarbazoles, vinylpyrrolidone; (meth)acrylonitrile, and (metha) crotononitrile.

Among these compounds, the followings are particularly preferred: (meth)acrylic acid, substituted or unsubstituted methyl (meth)acrylate, ethyl (meth)acrylate, straight or branched propyl (meth)acrylate, straight or branched butyl (meth)acrylate, straight or branched pentyl (meth)acrylate, normal hexyl (meth)acrylate, cyclohexyl (meth)acrylate, normal heptyl (meth)acrylate, 2-ethylhexyl (meth)acrylate, normal octyl (meth)acrylate, normal decyl (meth)acrylate, normal dodecyl (meth)acrylate;

substituted or unsubstituted adamantyl (meth)acrylate, isobornyl (meth)acrylate, norbornanemethyl (meth)acrylate, norbornenemethyl (meth)acrylate; substituted or unsubstituted benzyl (meth)acrylate, naphthylmethyl (meth)acrylate, anthracenemethyl (meth)acrylate, phenylethyl (meth)acrylate; substituted or unsubstituted phenyl (meth)acrylate, naphthyl (meth)acrylate;

(meth)acrylamide, substituted or unsubstituted (di)methyl (meth)acrylamide, (di)ethyl (meth)acrylamide, straight or branched (di)propyl (meth)acrylamide, straight or branched (di)butyl (meth)acrylamide, straight or branched (di)pentyl (meth)acrylamide, (di)normal hexyl (meth)acrylamide, (di)cyclohexyl (meth)acrylamide, (di-)2-ethylhexyl (meth)acrylamide; substituted or unsubstituted adamantyl (meth)acrylamide, nor-adamantyl (meth)acrylamide; substituted or unsubstituted benzyl (meth)acrylamide, naphthylethyl (meth)acrylamide, phenylethyl (meth)acrylamide; substituted or unsubstituted (di)phenyl (meth)acrylamide, naphthyl (meth)acrylamide, (meth)acryloylmorpholine, piperidyl acrylamide, pyrrolidyl acrylamide; (α-methyl-)styrene, vinylpyridine, vinylimidazole, vinyltriazole, maleic anhydride, methyl jasmonate; itaconic acid; crotonic acid, substituted or unsubstituted methyl crotonate, ethyl crotonate, straight or branched propyl crotonate, straight or branched butyl crotonate, straight or branched pentyl crotonate, normal hexyl crotonate, cyclohexyl crotonate, normal heptyl crotonate, 2-ethylhexyl crotonate, normal octyl crotonate, normal decyl crotonate, normal dodecyl crotonate; substituted or unsubstituted adamantyl crotonate, isobornyl crotonate, norbornanemethyl crotonate, norbornenemethyl crotonate; substituted or unsubstituted benzyl crotonate, napthylmethyl crotonate, anthracenemethyl crotonate, phenylethyl crotonate;

substituted or unsubstituted phenyl crotonate, naphthyl crotonate; substituted or unsubstituted benzoyloxyethylene, substituted or unsubstituted acetoxyethylene, substituted or unsubstituted vinyl-carbazole, and vinylpyrrolidone.

The above-mentioned carboxyl group may be in a form of metal slats.

The above-mentioned substituent preferably include $C_1$-$C_{20}$ alkyl groups, $C_1$-$C_{20}$ alkoxy groups, $C_1$-$C_{20}$ aralkyl groups, $C_1$-$C_{20}$ aryl groups, $C_1$-$C_{20}$ acyloxy groups, $C_1$-$C_{20}$ acyl groups, $C_1$-$C_{20}$ alkoxycarbonyl groups, $C_1$-$C_{20}$ arylcarbonyl groups, $C_1$-$C_{20}$ dialkylamino groups, $C_1$-$C_{20}$ alkylamino groups, halogen atom, cyano, furyl, furfuryl, tetrahydrofuryl, tetrahydrofurfuryl, alkylthio groups, trimethylsilyl, trifluoromethyl, carboxyl, thienyl, morpholino, and morpholinocarbonyl.

Among these groups, the followings are particularly preferred: $C_1$-$C_{15}$ alkyl groups, $C_1$-$C_{15}$ alkoxy groups, $C_1$-$C_{15}$ aralkyl groups, $C_1$-$C_{15}$ aryl groups, $C_1$-$C_{15}$ acyloxy groups, $C_1$-$C_{15}$ acyl groups, $C_1$-$C_{15}$ alkoxycarbonyl groups, $C_1$-$C_{15}$ arylcarbonyl groups, $C_1$-$C_{15}$ dialkylamino groups, $C_1$-$C_{15}$ alkylamino groups, halogen atom, cyano, furyl, furfuryl, tetrahydrofuryl, tetrahydrofurfuryl, alkylthio groups, trimethylsilyl, trifluoromethyl, carboxyl, thienyl, morpholino, and morpholinocarbonyl.

As the above-mentioned substituents, the particularly preferred ones are: methyl, ethyl, straight or branched propyl, straight or branched butyl, straight or branched pentyl, normal hexyl, cyclohexyl, normal heptyl, 2-ethylhexyl, normal octyl, normal decyl, normal dodecyl, methyloxy, ethyloxy, straight or branched propyloxy, straight or branched butyloxy, straight or branched pentyloxy, normal hexyloxy, cyclohexyloxy, normal heptyloxy, 2-ethylhexyloxy, normal octyloxy, normal decyloxy, normal dodecyloxy, benzyl, phenethyl, naphthylmethyl, naphthylethyl, phenyl, and naphthyl;

methylcarbonyloxy, ethylcarbonyloxy, straight or branched propylcarbonyloxy, straight or branched butylcarbonyloxy, straight or branched pentylcarbonyloxy, normal hexylcarbonyloxy, cyclohexylcarbonyloxy, normal heptylcarbonyloxy, 2-ethylhexylcarbonyloxy, normal octylcarbonyloxy, normal decylcarbonyloxy, normal dodecylcarbonyloxy;

methylcarbonyl (acetyl), ethylcarbonyl, straight or branched propylcarbonyl, straight or branched butylcarbonyl, straight or branched pentylcarbonyl, normal hexylcarbonyl, cyclohexylcarbonyl, normal heptylcarbonyl, 2-ethylhexylcarbonyl, normal octylcarbonyl, normal decylcarbonyl, normal dodecylcarbonyl;

methyloxycarbonyl, ethyloxycarbonyl, straight or branched propyloxycarbonyl, straight or branched butyloxycarbonyl, straight or branched pentyloxycarbonyl, normal hexyloxycarbonyl, cyclohexyloxycarbonyl, normal heptyloxycarbonyl, 2-ethylhexyloxycarbonyl, normal octyloxycarbonyl, normal decyloxycarbonyl, normal dodecyloxycarbonyl;

benzoyl, naphthylcarbonyl; (di)methylamino, (di)ethylamino, straight or branched (di)propylamino, straight or branched (di)butylamino, straight or branched (di)penylamino, (di) normal hexylamino, (di)cyclohexylamino, (di) normal heptylamino, (di) 2-ethylhexylamino; fluorine atom, chlorine atom, bromine atom; cyano, furyl, furfuryl, tetrahydrofuryl, tetrahydrofurfuryl, alkylthio groups, trimethylsilyl, trifluoromethyl, carboxyl, thienyl, morpholino, and morpholinocarbonyl.

In addition, these substituents may further be substituted by the above-mentioned substituent(s). However, alcoholic hydroxyl groups are excluded from the preferred examples because they sometimes decrease Tg.

In addition, (meth)acrylonitrile and (metha)crotononitrile may be exemplified as particularly preferred copolymer components (copolymeric monomers).

As for the above-mentioned copolymer components, other hydrophilic monomers, particularly those containing phosphoric acid, phosphoric ester, quaternary ammonium salt, ethyleneoxy chain, propyleneoxy chain, sulfonic acid and its salt, or morpholinoethyl, are useful.

The above-mentioned sulfonic acid group and carboxylic acid group may be in a form of metal salts.

In the binders used in the invention, there is no particular limitation in the species and number of the copolymerizing monomer, but the number is preferably in 1-12 species, more preferably 1-8 species, and most preferably 1-5 species.

The followings show specific examples of the binders (Compound (I-1) to (I-16)) used in the first embodiment of the invention, but they are not intended to limit the invention.

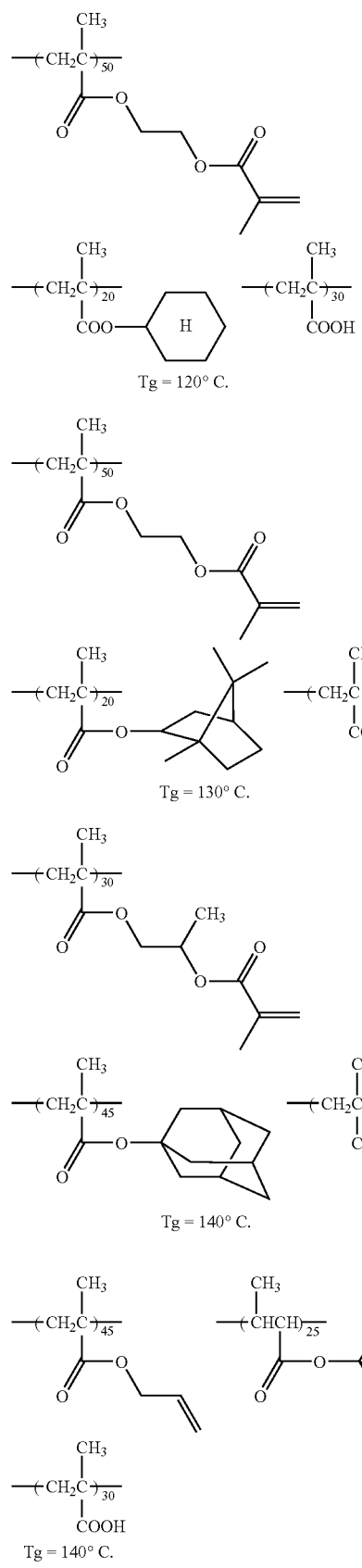
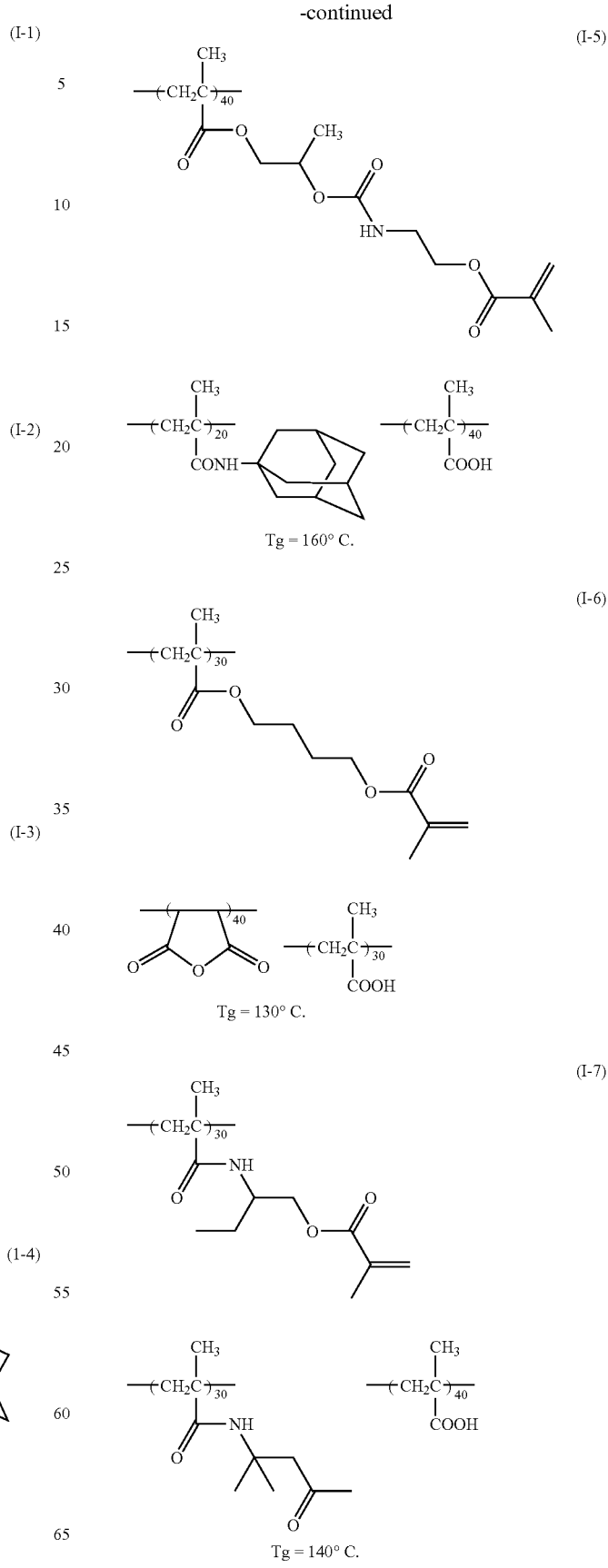

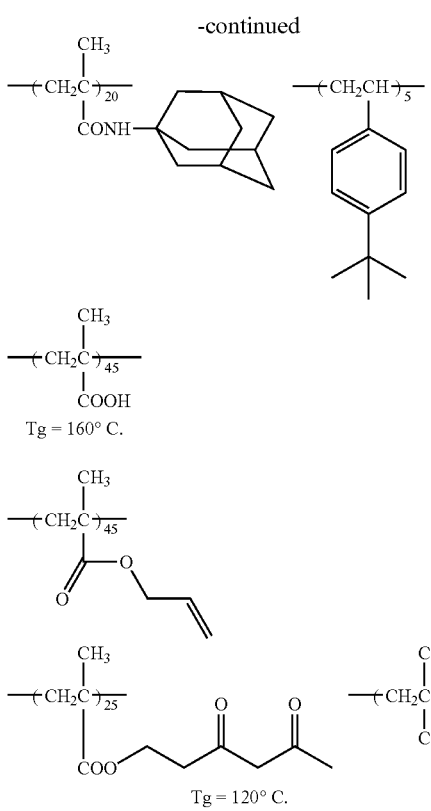

Tg = 160° C.

Tg = 120° C.

The dye-containing curable composition in the second embodiment of the invention contains the compound represented by the following general formula (II) as a binder. The use of the compound of the general formula (II) is effective in improvement of the curing property during light (or radiation) irradiation or in formation of a highly hardened pattern. Thus, since elution of the dye accompanied by a color mixture is suppressed, it is possible to obtain a highly resolved and better hue pattern and enhance the curing degree of the formed pattern. Moreover, it is also possible to improve the developing properties of the unhardened parts while suppressing decrease of the film residual rate in the hardened parts by development.

The followings will explain the compounds of the general formula (II).

General formula (II)

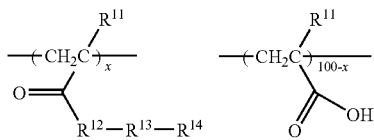

In the general formula (II), $R^{11}$ and $R^{12}$ respectively have the same significance as $R^1$ and $R^2$ in the general formula (I).

$R^{13}$ represents a substituted or unsubstituted divalent group, preferably a substituted or unsubstituted alkylene group having 1-30 carbons, substituted or unsubstituted alkyleneoxy group having 1-30 carbons, or substituted or unsubstituted ethyloxycarbonylaminoethyl having 1-30 carbons.

Among the alkylene group, alkyleneoxy group, and ethyloxycarbonylaminoethyl, those having 1 to 25 carbons are preferred, and more preferably those having 1 to 20 carbons are employed, and particularly methylene, ethylene, propylene, butylene, ethyleneoxy, diethyleneoxy, triethyleneoxy, and ethyloxycarbonylaminoethyl are preferred. These groups may contain (a) substituent(s).

The substituent on the above-mentioned $R^{13}$ is preferably a $C_1$-$C_{20}$ alkyl group or an OH group, more preferably a $C_1$-$C_{15}$ alkyl group or an OH group, even more preferably a $C_1$-$C_{10}$ alkyl group or an OH group, and particularly preferably a $C_1$-$C_7$ alkyl group or an OH group. Among these groups, methyl, ethyl, straight or branched propyl, butyl pentyl, hexyl, and OH group are most preferred in consideration of their starting materials and synthetic applicability.

The above-mentioned $R^{14}$ represents a group containing an unsaturated double bond, preferably selected from the group consisting of vinyloxy, allyloxy, (meth)acryloyloxy, 4-vinylphenyloxy, 4-vinylphenylmethyloxy, styryl, vinyl ester groups, and vinyl ether groups. Among them, vinyloxy, allyloxy, (meth)acryloyloxy, 4-vinylphenylmethyloxy, and vinyl ester groups are more preferred, and allyloxy, (meth)acryloyloxy and 4-vinylphenylmethyloxy are particularly preferred.

In the above-mentioned general formula (II), x indicates a molar fraction of a copolymerizing constituent unit and represents a value that satisfies $0 \leq x \leq 100$, which may be properly decided in consideration of the strength of film, elastic modulus, viscoelasticity, thermal resistance, synthetic applicability, Tg of polymers, solubility, developing properties, developing properties of the film, concentration of the developing solution, strength of the interaction with the dye and other components. In particular, the value is preferably 5 to 95, more preferably 10 to 90, and still more preferably 15 to 85.

The molecular weight of the compound represented by the general formula (II) is preferably 500 to 10,000,000 Da (Dalton: unit of molecular weight) as weight-average molecular weight, more preferably 1,000 to 5,000,000 Da, and most preferably 2,000 to 5,000,000 Da.

As for the above-mentioned binder, water-soluble or alkali-soluble are particularly preferred. The term "alkali-soluble" means that the binder is soluble in an aqueous solution of an alkaline compound as mentioned below or a mixture thereof with a water-miscible organic solvent.

The followings show specific examples of the compounds of the general formula (II) (Compound (II-1) to (II-20)), but they are not intended to limit the invention.

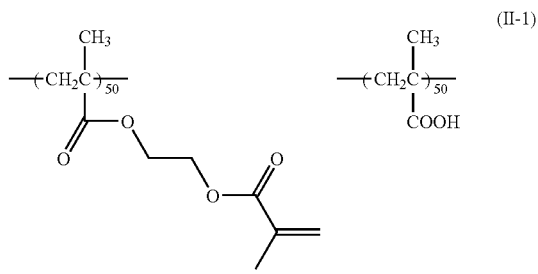

(II-1)

-continued
(II-2) 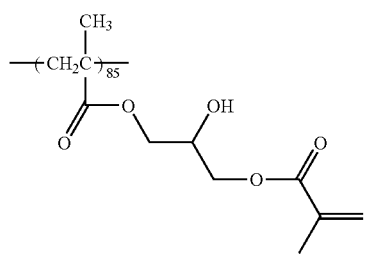 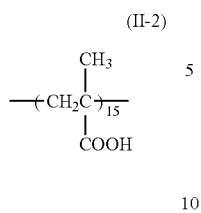
(II-3) 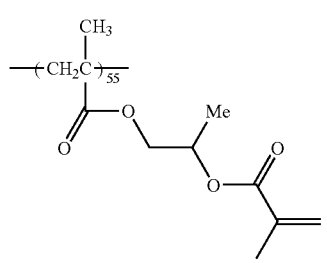 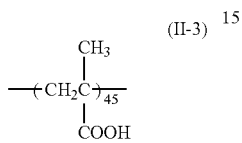
(II-4) 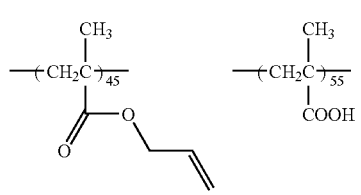 
(II-5) 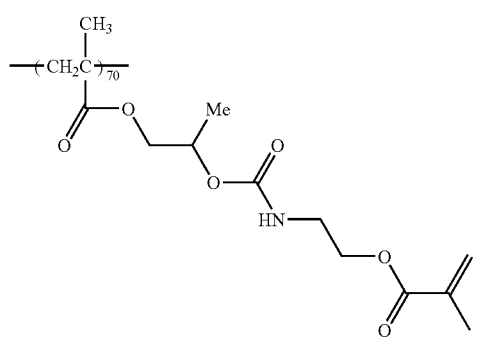 
(II-6) 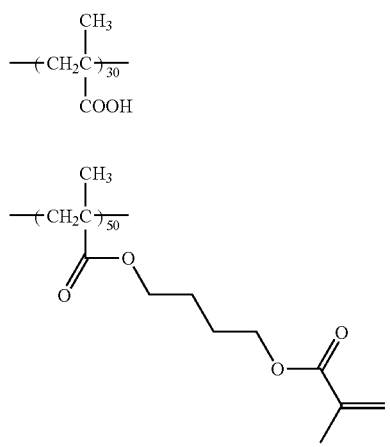 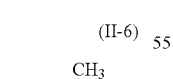
(II-7) 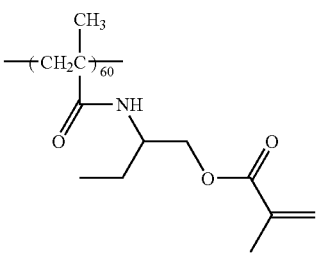 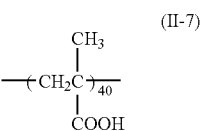
(II-8) 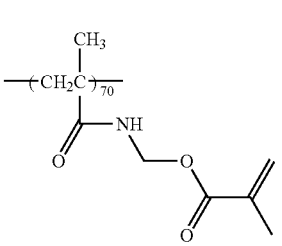 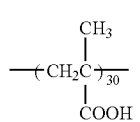
(II-9) 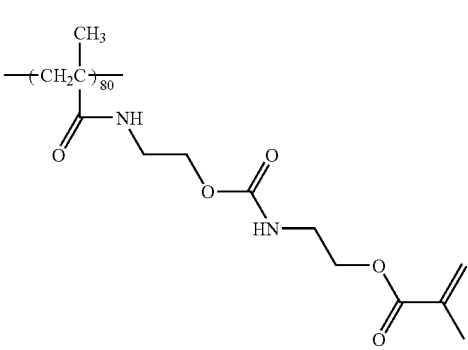
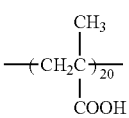
(II-10) 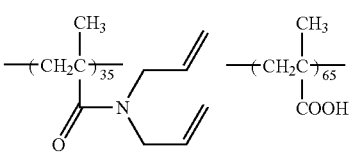
(II-11) 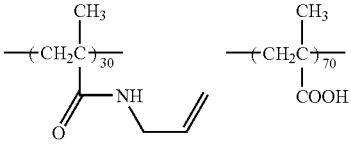
(II-12) 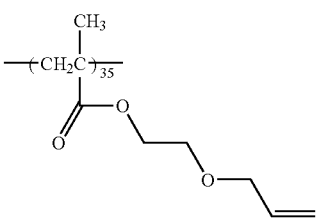 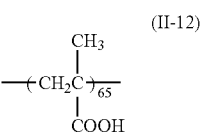

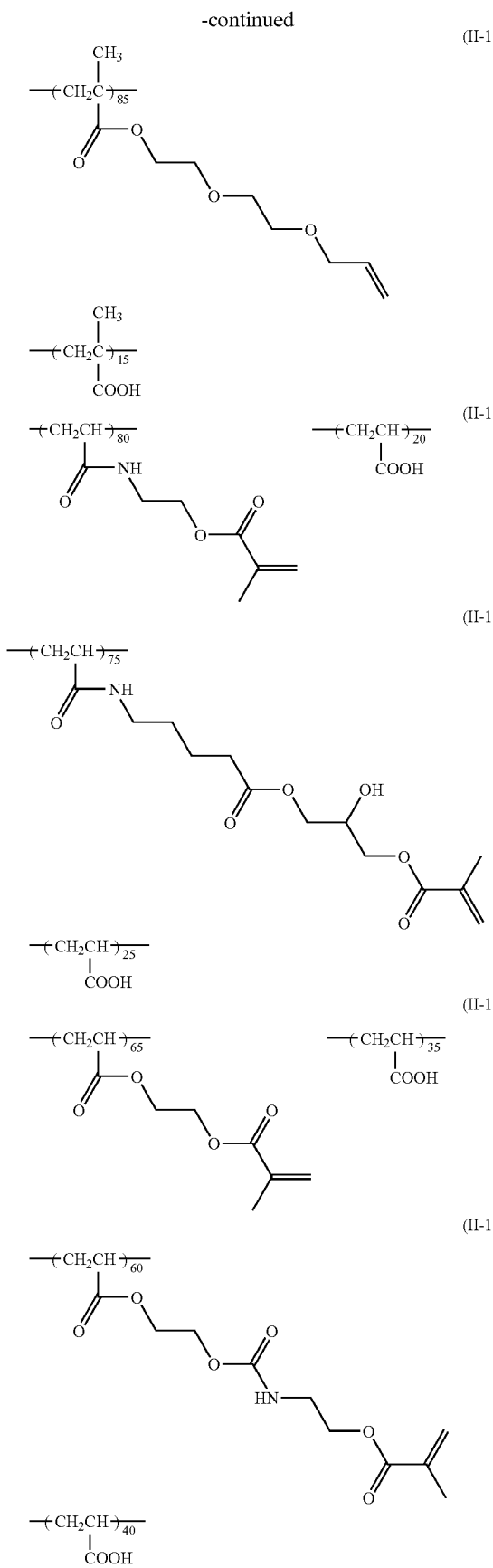

The content of the binder (the compound having a structural unit represented by the general formula (I) or the compound represented by the formula (II)) in the dye-containing curable composition is preferably in 10-90% by mass, more preferably 15-80% by mass, on the basis of the total solid components (mass) of the composition. When the content is less than 10% by mass, enhancement of the curing by light (radiation) irradiation is so insufficient as to spoil the effect of the invention such as thermal resistance, resolution, as well as the film residual rate in the hardened parts and the developing properties of the unhardened parts. When the content of the binder is over 90% by mass, the content of the other components is excessively decreased to spoil the developing properties and coloration.

In the dye-containing curable composition of the invention, a binder containing a structural unit represented by the general formula (I) may be used or a compound of the general formula (II) may be used in combination with the other known binder which will be mentioned below.

—Dye—

There is no particular limitation in the dye used in the invention as far as it is soluble in a solution of the dye-containing curable composition. It may be selected properly in consideration of all of the required performance such as solubility in an organic solvent or developing solution, absorbance, interaction with the other components contained in the curable composition, light resistance, thermal resistance, and so on.

As for the above-mentioned dye, those soluble in an organic solvent, for example, acidic dyes having acid groups such as sulfonic acid or carboxylic acid, salts of an acidic dye with a nitrogen-containing compound, and sulfonamides of the acidic dyes, can be employed.

The followings indicate specific examples of the acidic dyes, but they are not intended to limit the invention.

Acid alizarin violet N;
Acid black 1, 2, 24, 48;
Acid blue 1, 7, 9, 15, 23, 25, 27, 29, 40, 45, 62, 70, 74, 80, 83, 86, 90, 92, 112, 113, 120, 129, 138, 147, 158;
Acid chrome violet K;
Acid Fuchsin;
Acid green 1, 3, 5, 9, 25, 27, 50;
Acid orange 6, 7, 8, 10, 12, 50, 51, 52, 56, 63, 74, 95;
Acid red 1, 4, 8, 14, 17, 18, 26, 27, 29, 31, 32, 34, 35, 37, 42, 44, 50, 51, 52, 57, 66, 73, 80, 87, 88, 91, 92, 94, 97, 103, 111, 114, 129, 133, 134, 138, 143, 145, 150, 151, 158, 176, 183, 198, 211, 215, 216, 217, 249, 252, 257, 260, 266, 274, 356;
Acid violet 6B, 7, 9, 17, 19;
Acid yellow 1, 3, 9, 11, 17, 23, 25, 29, 34, 36, 42, 54, 72, 73, 76, 79, 98, 99, 111, 112, 114, 116, 135;
Food yellow 3; and
the derivatives thereof.

As for the sulfonamides of the above-mentioned acidic dyes, the above-mentioned sulfonamide derivatives of the acidic dyes may be employed suitably.

The followings will illustrate the nitrogen-containing compounds which form a salt with the acidic dyes or form an amide bond with the acidic dyes.

The nitrogen-containing compounds may be selected properly in consideration of all of the characteristics including solubility of the salts or amide compounds in an organic solvent or a developing solution, salt-forming ability, absorbance and color valency of the dye, and interaction with the other components in the composition. When the nitrogen containing compounds are selected only depending on the absorbance and color valency, it is appropriate to use those of which the molecular weight is as low as possible preferably the molecular weight of 220 or less, more preferably 200 or less, and particularly preferably lower than 180.

Among the dyes soluble in an organic solvent, preferable dyes are an azo-type acidic dye, a xanthene-type acidic dye, an anthraquinone-type acidic dye, a phthalocyanine-type acidic dye, a salt of one of these dyes and a nitrogen-containing compound, and a sulfonamide derivative of one of these dyes.

The followings are specific examples of the above-mentioned nitrogen compounds, which are not intended to limit the invention. In the following nitrogen-containing compounds, those having no —NH— group are not the nitrogen-containing compounds forming the amide bonds.

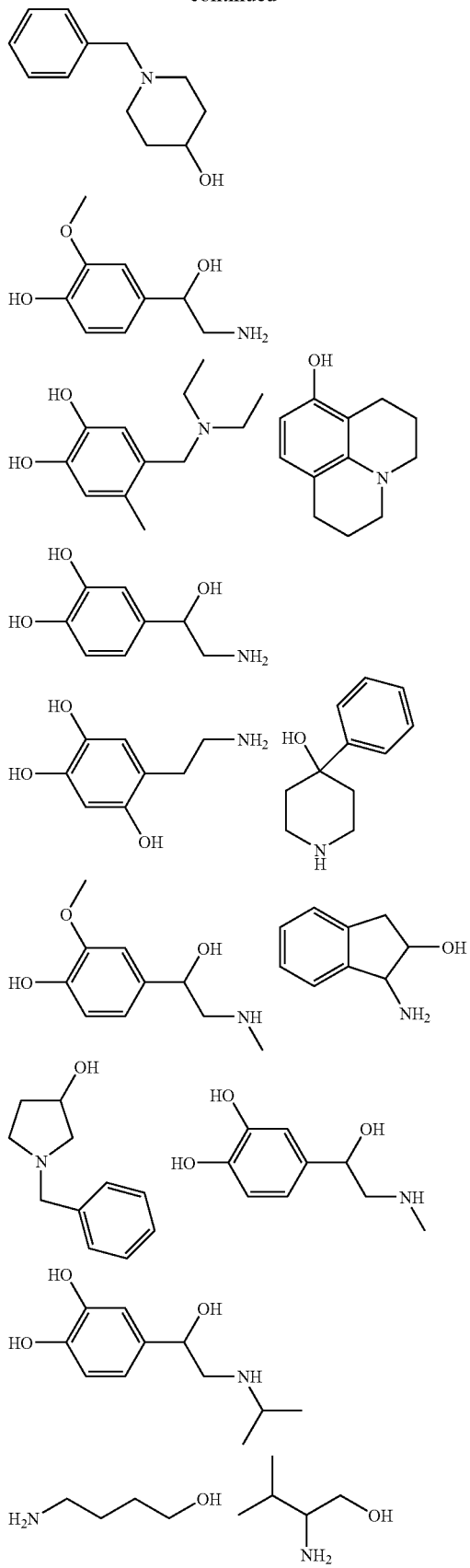

-continued

21
-continued
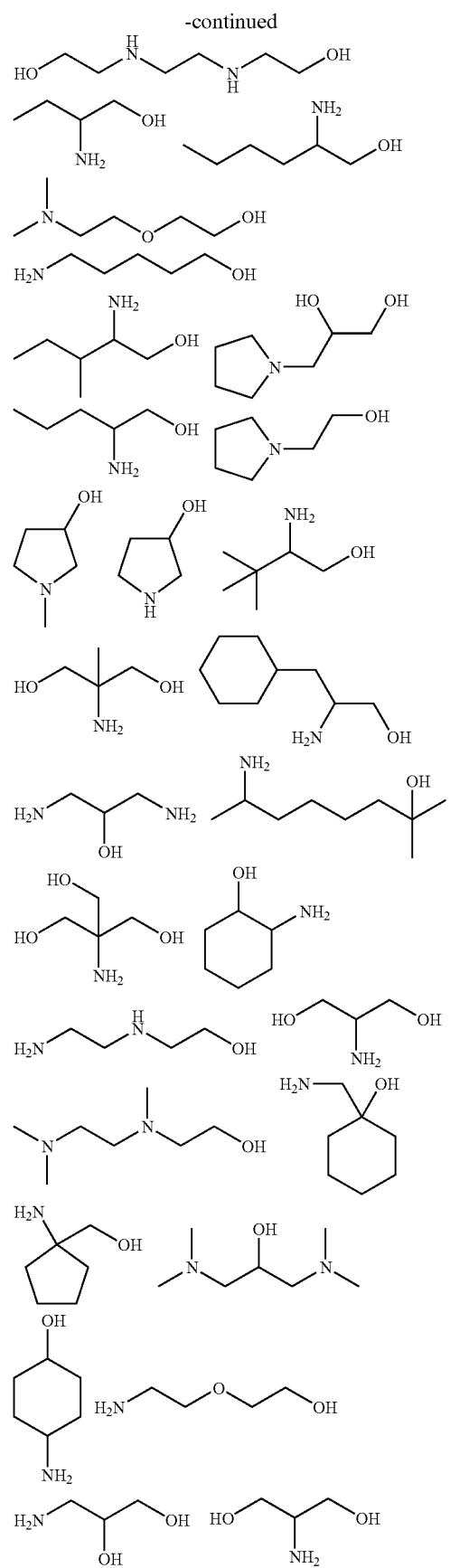
22
-continued
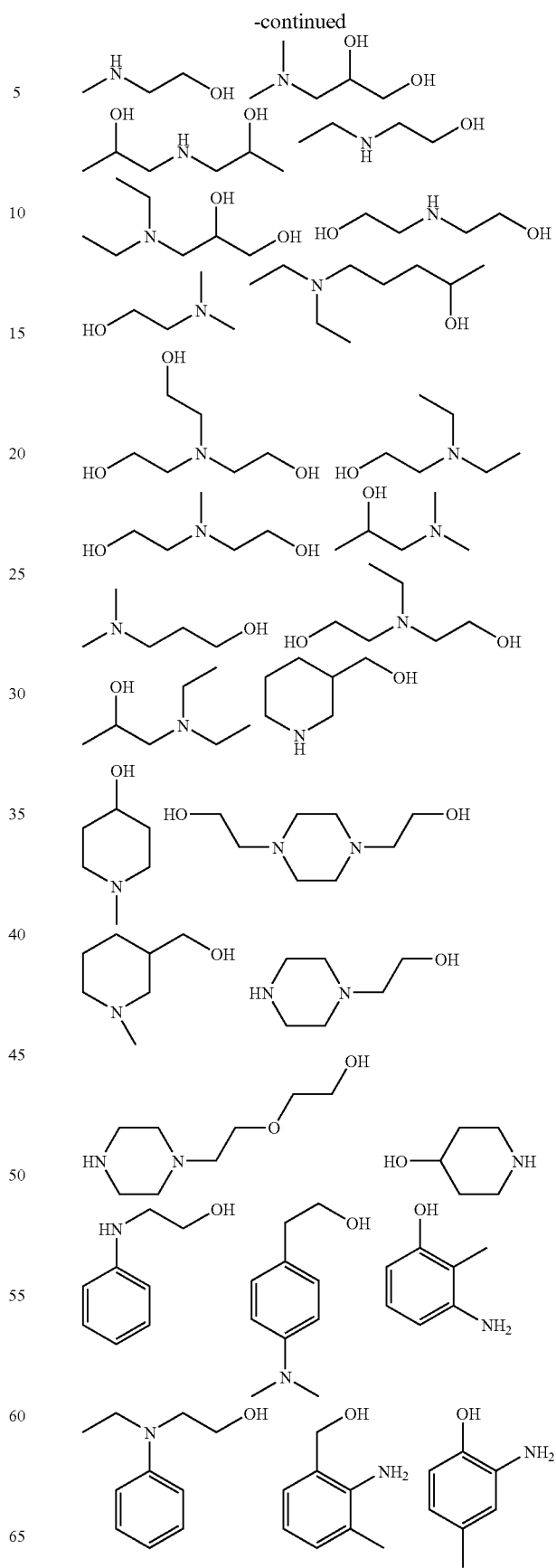

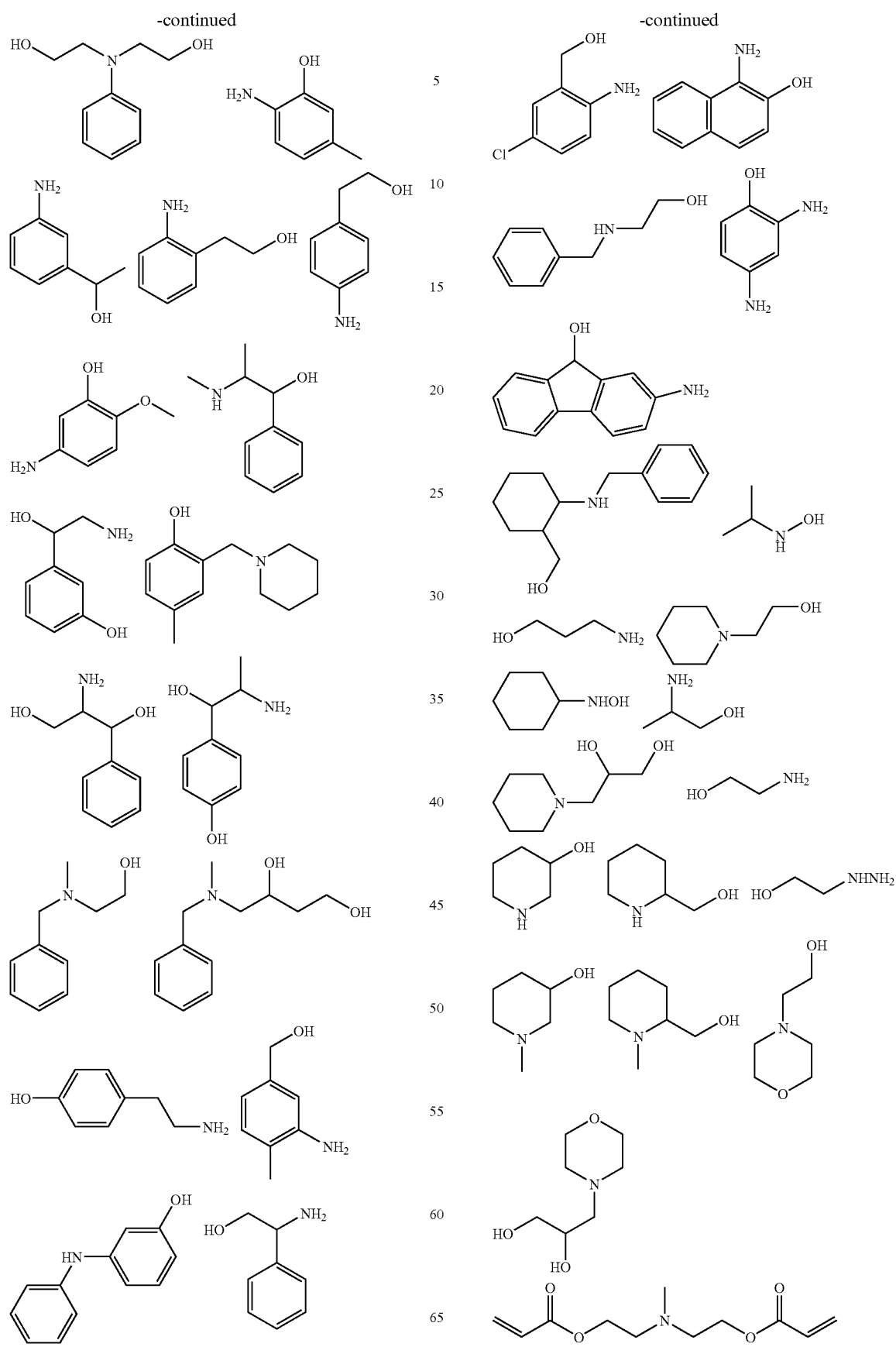

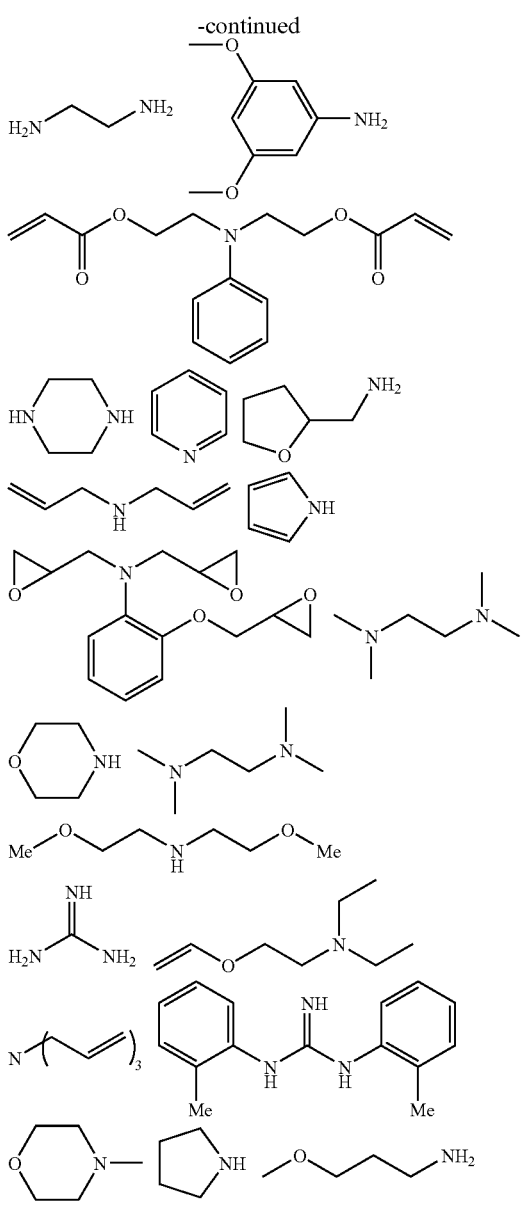

The concentration of the dye to be used can be demonstrated as follows. The concentration of the dye contained in the total solid components in the dye-containing curable composition of the invention depends on the type of the dye to be used and it is preferably in 0.5-80% by mass, more preferably 0.5-60% by mass, and most preferably 0.5-50% by mass.

—Other Components—

When the dye-containing curable composition of the invention is constituted as a negative-type of curable composition, other components such as another binder, photo-polymerization initiator, photo-acid-generating agent, monomer, cross-linking agent, thermal polymerization inhibitors, and so on may be used together with the above-mentioned dye and the binder of the invention. On the other hand, when the curable composition is constituted as a positive-type, it is appropriate to use a binder dissolution suppressor such as a naphthoquinone diazide compound in addition to the above-mentioned other components, or to use simultaneously another binder improving the alkaline solubility with an acid. The followings will illustrate the materials to be used.

<Other Binders>

The other binders that can be used together with the binder as mentioned in the first or second embodiment can be demonstrated as follows. Though there is no particular limitation in the other binders as far as they are alkali-soluble, it is preferred to select them in view of their thermal resistance, developing properties, and availability.

As for the alkali-soluble binder, it is appropriate to use a linear organic high molecular polymer which is soluble in an organic solvent and can be developed with a weakly alkaline aqueous solution. Such a linear organic polymer includes those having a carboxylic acid on the side chain, for example, methacrylic acid copolymer, acrylic acid copolymer, itaconic acid copolymer, crotonic acid copolymer, maleic acid copolymer, and partially esterified maleic acid copolymer, as well as acidic cellulose derivatives having a carboxylic acid on the side chain, as described in JP-A No. 59-44615, JP-B Nos. 54-34327, 58-12577 and 54-25957, JP-A Nos. 59-53836 and 59-71048.

In addition, hydroxyl-containing polymers to which is added an acid anhydride, as well as polyhydroxystyrene resin, polysiloxane resin, poly(2-hydroxyethyl(meth)acrylate), polyvinylpyrrolidone, polyethylene oxide, and polyvinyl alcohol are also useful.

In the first embodiment, a binder which comprises a component (so-called copolymer component) constituting the binder of the invention together with the structural unit represented by the general formula (I) as mentioned above can be used effectively.

The binder may be of a copolymer derived from a hydrophilic monomer including, for example, alkoxyalkyl (meth)acrylate, hydroxyalkyl (meth)acrylate, glycerol (meth)acrylate, (meth)acrylamide, N-methylol acrylamide, secondary or tertiary alkyl acrylamide, dialkylaminoalkyl (meth)acrylate, morpholine (meth)acrylate, N-vinylpyrrolidone, N-vinylcaprolactam, vinylimidazole, vinyltriazole, methyl (meth)acrylate, ethyl (meth)acrylate, straight or branched propyl (meth)acrylate, straight or branched butyl (meth)acrylate, phenoxyhydroxypropyl (meth)acrylate, and other monomers containing tetrahydrofurfuryl, phosphoric acid, phosphoric acid ester, quaternary ammonium, ethyleneoxy chain, propylene oxy chain, sulfonic acid and its salt, or morpholinoethyl.

In the first embodiment, the other binder which is used in combination with the binder of the invention containing a structural unit represented by the formula (I) and having the glass transition temperature (Tg) in the range of 0 to 250° C., may contain an alcoholic hydroxyl group if the viscoelasticity and Tg are kept within the desired range.

In view of enhancement of the cross-linking efficiency, the binder may contain a polymerizing group on the side chain, that is, a polymer having allyl, (meth)acryl, or allyloxyalkyl group on the side chain is useful. The examples of the polymers having a polymerizing group on the side chain include KS Resist-106 (Osaka Organic Chemical Ind. Co., Ltd.) and Cyclomer P-series (Daicel Chemical Ind., Ltd.).

In view of enhancement of the strength of the cured film, alcohol soluble nylon or a polyether of 2,2-bis-(4-hydroxyphenyl)-propane and epichlorohydrin is useful.

Among these various binders, polyhydroxystyrene resin, polysiloxane resin, acryl resin, acrylamide resin, or acryl/acrylamide copolymer resin is preferred in view of thermal resistance. And acryl resin, acrylamide resin, or acryl/acrylamide copolymer resin is preferred in view of the control of developing properties. When the binder of the first viewpoint is used simultaneously, it is preferable to use a binder comprising a component (so-called copolymer component) constituting a high molecular compound together with the structural unit represented by the general formula (I).

As for the above-mentioned acryl resin, a copolymer comprising a monomer selected from benzyl (meth)acrylate, (meth)acrylic acid, hydroxyethyl (meth)acrylate, or (meth) acrylamide, and KS Resist-106 (Osaka Organic Chemical Ind. Co., Ltd.), Cyclomer P-series, are preferred.

Alkali-soluble phenol resin is also useful. The alkali soluble phenol resin includes, for example, novolac resin and vinyl polymer.

The examples of the novolac resin include those prepared by condensation of a phenol and an aldehyde in the presence of an acid catalyst. The phenol includes, for example, phenol, cresol, ethylphenol, butylphenol, xylenol, phenylphenol, catechol, resorcinol, pyrogallol, naphthol, and bisphenol A. These phenols may be used alone or in combination of two or more. The aldehyde includes, for example, formaldehyde, paraformaldehyde, acetaldehyde, propionaldehyde, and benzaldehyde.

Specific example of the above-mentioned novolac resin includes a condensate of formalin with meta-cresol, para-cresol or a mixture thereof. The novolac resin may be allowed to adjust its molecular weight distribution by such technique as separation. A low molecular weight component having a phenolic hydroxyl group such as bisphenol C or bisphenol A may be added to the novolac resin.

The weight-average molecular weight of the other binder (reduced value of polystyrene determined by GPC) is preferably in 500 to 10,000,000 Da (Dalton: unit of molecular weight), more preferably 1,000 to 5,000,000 Da, and most preferably 2,000 to 5,000,000 Da.

Since the other binder as mentioned above is used in combination with the binder of the invention, it is not necessary to use it when the binder of the invention per se exhibits its performance sufficiently.

When the binder of the invention is used together with another binder, the other binder may preferably be used in the amount of 0-90% by mass, more preferably 0-80% by mass, and still more preferably 0-70% by mass, on the basis of the total solid components of the curable composition.

<Cross-linking Agent>

In the invention, it is possible to use an auxiliary cross-linking agent to give a highly hardened film. The followings will explain the cross-linking agent.

There is no particular limitation in the cross-linking agent usable in the invention as far as it can be used in the cross-linking reaction for film curing. The examples thereof include (a) epoxy resin; (b) melamine compounds, guanamine compounds, glycoluryl compounds or urea compounds substituted by at least one substituent selected from methylol, alkoxymethyl and acyloxymethyl groups; (c) phenol compounds, naphthol compounds or hydroxyanthracene compounds substituted by at least one substituent selected from methylol, alkoxymethyl and acyloxymethyl groups. In particular, multi-sensitive epoxy resin is preferred.

As for the epoxy resin (a), those having an epoxy group with cross-linking ability can be used. The examples thereof include low molecular compounds having a divalent glycidyl group such as bisphenol A diglycidyl ether, ethylene glycol diglycidyl ether, butanediol diglycidyl ether, hexanediol diglycidyl ether, dihydroxybiphenyl diglycidyl ether, diglycidyl phthalate, N,N-diglycidylaniline; similarly, low molecular compounds having a trivalent glycidyl group typified by trimethylol-propane triglycidyl ether, trimethylolphenol triglycidyl ether, Tris P-PA triglycidyl ether; similarly, low molecular compounds having a tetravalent glycidyl group typified by pentaerythritol tetraglycidyl ether, tetramethylol bisphenol A tetraglycidyl ether; similarly, low molecular compounds having a multivalent glycidyl group such as dipentaerythritol pentaglycidyl ether, dipentaerythritol hexaglycidyl ether; and high molecular compounds having a glycidyl group typified by polyglycidyl (meth)acrylate, 1,2-epoxy-4-(2-oxiranyl)cyclohexane adduct of 2,2-bis(hydroxymethyl)-1-butanol.

The number of the substituents, i.e., methylol, alkoxymethyl or acyloxymethyl group, contained in the cross-linking agent (b) is 2 to 6, preferably 5 to 6 in the melamine compound, and 2 to 4, preferably 3 to 4 in the glycoluryl, guanamine and urea compounds.

Hereinafter, the compounds as mentioned in the item (b), i.e., melamine compounds, guanamine compounds, glycoluryl compounds and urea compounds, are briefly referred to as compounds relating to (b)(containing (a) methylol, alkoxymethyl or acyloxymethyl group(s)).

The compounds relating to (b) containing (a) methylol group(s) can be produced by heating the compounds relating to (b) containing (an) alkoxymethyl group(s) in alcohol in the presence of an acid catalyst such as hydrochloric acid, sulfuric acid, nitric acid or methanesulfonic acid. The compounds relating to (b) containing (an) acyloxymethyl group(s) can be produced by agitating a mixture of the compounds relating to (b) containing (a) methylol group(s) and an acyl chloride in the presence of a basic catalyst.

Specific examples of the compounds relating to (b) containing the above-mentioned substituents are as follows.

The melamine compounds include, for example, hexamethylol melamine, hexamethoxymethyl melamine, hexamethylol melamine in which 1 to 5 of methylol groups are methoxymethylated or mixture thereof, hexamethoxyethyl melamine, hexaacyloxymethyl melamine, and hexamethylol melamine in which 1 to 5 of methylol groups are acyloxymethylated or mixture thereof.

The guanamine compounds include, for example, tetramethylol guanamine, tetramethoxymethyl guanamine, tetramethylol guanamine in which 1 to 3 of methylol groups are methoxymethylated or mixture thereof, tetramethoxyethyl guanamine, tetraacyloxymethyl guanamine, and tetramethylol guanamine in which 1 to 3 of methylol groups are acyloxymethylated or mixture thereof.

The glycoluryl compounds include, for example, tetramethylol glycoluryl, tetramethoxymethyl glycoluryl, tetramethylol glycoluryl in which 1 to 3 of methylol groups are methoxymethylated or mixture thereof, and tetramethylol glycoluryl in which 1 to 3 of methylol groups are acyloxymethylated or mixture thereof.

The urea compound includes, for example, tetramethylol urea, tetramethoxymethyl urea, tetramethylol urea in which 1 to 3 of methylol groups are methoxymethylated or mixture thereof, and tetramethoxyethyl urea.

The compounds relating to (b) may be used alone or in combination.

The cross-linking agents of the item (c), that is, phenol compounds, naphthol compounds or hydroxyanthracene compounds substituted by at least one group selected from methylol, alkoxymethyl and acyloxymethyl groups, work to suppress intermixing of the final coating photoresist by thermal cross-linking and further enhance the film strength. Hereinafter, these compounds are sometimes briefly referred to as the compounds relating to (c) containing (a) methylol, alkoxymethyl or acyloxymethyl group(s).

The number of the methylol, alkoxymethyl or acyloxymethyl group contained in the cross-linking agent (c) is at least 2 for one molecule, and in view of the thermal cross-linking ability and storage stability it is appropriate that the substitution is made at both of the 2 and 4 positions of the skeletal phenol compound. In this connection, the skeletal naphthol and hydroxyanthracene compounds are preferably substituted at both of the ortho and para positions of the OH group. The phenol compounds may be substituted or unsubstituted at the 3 or 5 position.

In the naphthol compounds, the other position(s) than the ortho of the OH group may be substituted or unsubstituted.

The compounds relating to (c) containing (a) methylol group(s) can be produced by allowing the starting compounds, in which the 2 or 4 position of the phenolic OH group is hydrogen atom, to react with formalin in the presence of a basic catalyst such as sodium hydroxide, potassium hydroxide, ammonia, or tetralkylammonium hydroxide.

The compounds relating to (c) containing (an) alkoxymethyl group(s) can be produced by heating the compounds relating to (c) containing (a) methylol group(s) in alcohol in the presence of an acid catalyst such as hydrochloric acid, sulfuric acid, nitric acid or methanesulfonic acid.

The compounds relating to (c) containing (an) acyloxymethyl group(s) can be produced by allowing a mixture of the compounds relating to (c) containing (a) methylol group(s) to react with an acyl chloride in the presence of a basic catalyst.

The skeletal compounds in the cross-linking agents (c) include phenol compounds in which the ortho or para position of the phenolic OH group is unsubstituted, naphthol and hydroxyanthracene compounds, for example, phenol, cresol including respective isomers, 2,3-xylenol, 2,5-xylenol, 3,4-xylenol, 3,5-xylenol, bisphenols such as bisphenol A, 4,4'-bishydroxybiphenyl, Tris P-PA (Honshu Chemical Ind. Co., Ltd.), naphthol, dihydroxynaphthalene, and 2,7-dihydroxyanthracene.

Specific examples of the cross-linking agents (c) include phenol compounds, for example, trimethylol phenol, tri (methoxymethyl)phenol, trimethylol phenol in which 1 to 2 of methylol groups are methoxymethylated, trimethylol-3-cresol, tri(methoxymethyl)-3-cresol, trimethylol-3-cresol in which 1 to 2 of methylol groups are methoxymethylated; dimethylolcresol such as 2,6-dimethylol-4-cresol; tetramethylol bisphenol A, tetramethoxymethyl bisphenol A, tetramethylol bisphenol A in which 1 to 3 of methylol groups are methoxymethylated, tetramethylol-4,4'-bishydroxybiphenyl, tetramethoxymethyl-4,4'-bishydroxybiphenyl, Tris P-PA hexamethylol derivatives, Tris P-PA hexamethoxymethyl derivatives, Tris P-PA hexamethylol derivatives in which 1 to 5 of methylol groups are methoxymethylated, and bishydroxymethylnaphthalenediol.

The hydroxyanthracene compound includes, for example, 1,6-dihydroxymethyl-2,7-dihydroxyanthracene. The compound containing (an) acyloxymethyl group(s) includes, for example, the above-mentioned methylol-containing compounds in which the methylol groups are partially or totally acyloxymethylated.

The preferred one among these compounds is trimethylol phenol, bishydroxymethyl-p-cresol, tetramethylol bisphenol A, Tris P-PA (Honshu Chemical Ind. Co., Ltd.) hexamethylol derivative or a phenol derivative in which the methylol groups are replaced by an alkoxymethyl group or by both of methylol group and alkoxymethyl group.

The compounds relating to (c) may be used alone or in combination.

In this invention, it is not always necessary to add the above-mentioned cross-linking agent. If added, the total content of the cross-linking agents (a) to (c) to be added into the dye-containing curable composition depends on the materials to be used, but it is preferably in 0-70% by mass, more preferably in 0-50% by mass, and particularly in 0-30% by mass.

<Monomers or Oligomers>

Next, monomers or oligomers having at least one ethylenic unsaturation are explained.

The monomers or oligomers having at least one ethylenic unsaturation are preferably compounds having at least one ethylenic double bond, through which addition and polymerization are allowed, and showing the boiling point higher than 100° C. under atmospheric pressure. In the presence of a photo-polymerization initiator as mentioned below, the compound acts to make the dye-containing curable composition into the negative type. Moreover, the compound may be added to a positive type of the dye-containing curable composition in order to further enhance the hardness.

The examples thereof include mono-functional acrylates or methacrylates such as polyethylene glycol mono(meth) acrylate, polypropylene glycol mono(meth)acrylate, phenoxyethyl (meth)acrylate; polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol penta (meth)acrylate, dipentaerythritol hexa(meth)acrylate, hexanediol (meth)acrylate; multi-functional acrylates or methacrylates or their mixtures such as trimethylolpropane tri(acryloyloxypropyl)ether, tri(acryloyloxyethyl) isocyanurate, (meth)acrylate derivatives prepared by adding ethylene oxide or propylene oxide to a multi-functional alcohol such as glycerin or trimethylolethane followed by (meth)acrylate formation, urethane acrylates as described in JP-B Nos. 48-41708, 50-6034, JP-A No. 51-37193, polyester acrylates as described in JP-A No. 48-64183, JP-B Nos. 49-43191, 52-30490; and epoxyacrylates produced by reaction of epoxy resin with (meth)acrylic acid. In addition, the examples also include photo-curing monomers and oligomers disclosed in Nippon Settyaku Kyokai Shi (Journal of Adhesion Society of Japan) vol. 20, no. 7, 300-308.

<Photo-polymerization Initiators and Others>

The photo-polymerization initiators are explained as follows. The photo-polymerization initiator, when the dye-containing curable composition of the invention is of a negative type, may be added together with the above-mentioned monomer, and when the composition is of a positive type, the initiator may be added according to necessity. As for the photo-polymerization initiators, there is no particular limitation as far as they allow the polymerization of the above-mentioned monomer or oligomer, but it is appropriate to select them in consideration of their characteristics, initiation efficiency, absorption wavelength, availability, cost, and so on.

The examples of the photo-polymerization initiators include at least one halogenated compound selected from halomethyl oxadiazole compounds and halomethyl-s-triazine compounds, 3-aryl-substituted coumalin compounds, lophine dimer, benzophenone compounds, acetophenone compounds and their derivatives, cyclopentadiene-benzene-iron complex and salts thereof, and oxime compounds.

The active halogenated compounds as halomethyloxadiazole compounds include 2-halomethyl-5-vinyl-1,3,4-oxadizaole compounds as described in JP-B No. 57-6096, 2-trichloromethyl-5-styryl-1,3,4-oxadiazole, 2-trichloromethyl-5-(p-cyanostyryl)-1,3,4-oxadiazole, and 2-trichloromethyl-5-(p-methoxystyryl)-1,3,4-oxadiazole.

The active halogenated compounds as halomethyl-s-triazine compounds include vinyl-halomethyl-s-triazine compounds as described in JP-B No. 59-1281, 2-(naphtho-1-yl)-4,6-bis-halomethyl-s-triazine compounds and 4-(p-aminophenyl)-2,6-di-halomethyl-s-triazine compounds as described in JP-A No. 53-133428.

Specifically, the examples thereof include: 2,4-bis(trichloromethyl)-6-p-methoxystyryl-s-triazine, 2,6-bis(trichloromethyl)-4-(3,4-methylenedioxyphenyl)-1,3,5-triazine, 2,6-bis(trichloromethyl)-4-(4-methoxyphenyl)-1,3,5-triazine, 2,4-bis(trichloromethyl)-6-(1-p-dimethylaminophenyl-1,3-butadienyl)-s-triazine, 2-trichloromethyl-4-amino-6-p-methoxystyryl-s-triazine, 2-(naphtho-1-yl)-4,6-bis-trichloromethyl-s-triazine, 2-(4-methoxy-naphtho-1-yl)-4,6-bis-trichloromethyl-s-triazine, 2-(4-ethoxy-naphtho-1-yl)-4,6-bis-trichloromethyl-s-triazine, 2-(4-butoxy-naphtho-1-yl)-4,6-bis-trichloromethyl-s-triazine, 2-[4-(2-methoxyethyl)-naphtho-1-yl]-4,6-bis-trichloromethyl-s-triazine;

2-[4-(2-ethoxyethyl)-naphtho-1-yl]-4,6-bis-trichloromethyl-s-triazine, 2-[4-(2-butoxyethyl)-naphtho-1-yl]-4,6-bis-trichloromethyl-s-triazine, 2-(2-methoxy-naphtho-1-yl)-4,6-bis-trichloromethyl-s-triazine, 2-(6-methoxy-5-methyl-naphtho-2-yl)-4,6-bis-trichloromethyl-s-triazine, 2-(6-methoxy-naphtho-2-yl)-4,6-bis-trichloromethyl-s-triazine, 2-(5-methoxy-naphtho-1-yl)-4,6-bis-trichloromethyl-s-triazine, 2-(4,7-dimethoxy-naphtho-1-yl)-4,6-bis-trichloromethyl-s-triazine, 2-(6-ethoxy-naphtho-2-yl)-4,6-bis-trichloromethyl-s-triazine, 2-(4,5-dimethoxy-naphtho-1-yl)-4,6-bis-trichloromethyl-s-triazine;

4-[p-N,N-di(ethoxycarbonylmethyl)aminophenyl]-2,6-di(trichloromethyl)-s-triazine, 4-[o-methyl-p-N,N-di(ethoxycarbonylmethyl)aminophenyl]-2,6-di(trichloromethyl)-s-triazine, 4-[p-N,N-di(chloroethyl)aminophenyl]-2,6-di(trichloromethyl)-s-triazine, 4-[o-methyl-p-N,N-di(chloroethyl)aminophenyl]-2,6-di(trichloromethyl)-s-triazine, 4-(p-N-chloroethylaminophenyl)-2,6-di(trichloromethyl)-s-triazine, 4-(p-N-ethoxycarbonylmethylaminophenyl)-2,6-di(trichloromethyl)-s-triazine, 4-[p-N,N-di(phenyl)aminophenyl]-2,6-di(trichloromethyl)-s-triazine, 4-(p-N-chloroethylcarbonylaminophenyl)-2,6-di(trichloromethyl)-s-triazine;

4-[p-N-(p-methoxyphenyl)carbonylaminophenyl]-2,6-di(trichloromethyl)-s-triazine, 4-[m-N,N-di(ethoxycarbonylmethyl)aminophenyl]-2,6-di(trichloromethyl)-s-triazine, 4-[m-bromo-p-N,N-di(ethoxycarbonylmethyl)aminophenyl]-2,6-di(trichloromethyl)-s-triazine, 4-[m-chloro-p-N,N-di(ethoxycarbonylmethyl)aminophenyl]-2,6-di(trichloromethyl)-s-triazine, 4-[m-fluoro-p-N,N-di(ethoxycarbonylmethyl)aminophenyl]-2,6-di(trichloromethyl)-s-triazine, 4-[o-bromo-p-N,N-di(ethoxycarbonylmethyl)aminophenyl]-2,6-di(trichloromethyl)-s-triazine, 4-[o-chloro-p-N,N-di(ethoxycarbonylmethyl)aminophenyl]-2,6-di(trichloromethyl)-s-triazine, 4-[o-fluoro-p-N,N-di(ethoxycarbonylmethyl)aminophenyl]-2,6-di(trichloromethyl)-s-triazine, 4-[o-bromo-p-N,N-di(chloroethyl)aminophenyl]-2,6-di(trichloromethyl)-s-triazine, 4-[o-chloro-p-N,N-di(chloroethyl)aminophenyl]-2,6-di(trichloromethyl)-s-triazine, 4-[o-fluoro-p-N,N-di(chloroethyl)aminophenyl]-2,6-di(trichloromethyl)-s-triazine, 4-[m-bromo-p-N,N-di(chloroethyl)aminophenyl]-2,6-di(trichloromethyl)-s-triazine, 4-[m-chloro-p-N,N-di(chloroethyl)aminophenyl]-2,6-di(trichloromethyl)-s-triazine;

4-[m-fluoro-p-N,N-di(chloroethyl)aminophenyl]-2,6-di(trichloromethyl)-s-triazine, 4-(m-bromo-p-N-ethoxycarbonylmethylaminophenyl)-2,6-di(trichloromethyl)-s-triazine, 4-(m-chloro-p-N-ethoxycarbonylmethylaminophenyl)-2,6-di(trichloromethyl)-s-triazine, 4-(m-fluoro-p-N-ethoxycarbonylmethylaminophenyl)-2,6-di(trichloromethyl)-s-triazine, 4-(o-bromo-p-N-ethoxycarbonylmethylaminophenyl)-2,6-di(trichloromethyl)-s-triazine, 4-(o-chloro-p-N-ethoxycarbonylmethylaminophenyl)-2,6-di(trichloromethyl)-s-triazine;

4-(o-fluoro-p-N-ethoxycarbonylmethylaminophenyl)-2,6-di(trichloromethyl)-s-triazine, 4-(m-bromo-p-N-chloroethylaminophenyl)-2,6-di(trichloromethyl)-s-triazine, 4-(m-chloro-p-N-chloroethylaminophenyl)-2,6-di(trichloromethyl)-s-triazine, 4-(m-fluoro-p-N-chloroethylaminophenyl)-2,6-di(trichloromethyl)-s-triazine, 4-(o-bromo-p-N-chloroethylaminophenyl)-2,6-di(trichloromethyl)-s-triazine, 4-(o-chloro-p-N-chloroethylaminophenyl)-2,6-di(trichloromethyl)-s-triazine, and 4-(o-fluoro-p-N-chloroethylaminophenyl)-2,6-di(trichloromethyl)-s-triazine.

In addition, the following compounds can be used effectively: TAZ series of Midori Kagaku Co., Ltd. (for example, TAZ-107, TAZ-110, TAZ-104, TAZ-109, TAZ-140, TAZ-204, TAZ-113, TAZ-123), T series of PANCHIM Inc. (for example, T-OMS, T-BMP, T-R, T-B), Irgacure series of Ciba-Geigy AG (for example, Irgacure 651, Irgacure 184, Irgacure 500, Irgacure 1000, Irgacure 149, Irgacure 819, Irgacure 261), Durocure series (for example, Durocure 1173), 4,4'-bis(diethylamino)-benzophenone, 2-(O-benzoyloxime)-1-[4-(phenylthio)phenyl]-1,2-octadiene, 2-benzyl-2-dimethylamino-4-morpholinobutyrophenone, 2,2-dimethoxy-2-phenylacetophenone;

2-(o-chlorophenyl)-4,5-diphenylimidazolyl dimer, 2-(o-fluorophenyl)-4,5-diphenylimidazolyl dimer, 2-(o-methoxyphenyl)-4,5-diphenylimidazolyl dimer, 2-(p-methoxyphenyl)-4,5-diphenylimidazolyl dimer, 2-(p-methoxyphenyl)-4,5-diphenylimidazolyl dimer, 2-(2,4-dimethoxyphenyl)-4,5-diphenylimidazolyl dimer, 2-(p-methylmercaptophenyl)-4,5-diphenylimidazolyl dimer, and benzoin isopropyl ether.

In these photo-polymerization initiators, a sensitizer or photo-stabilizer can be used in combination.

The specific examples of such reagents include benzoin, benzoin methyl ether, 9-fluorenone, 2-chloro-9-fluorenone, 2-methyl-9-fluorenone, 9-anthrone, 2-bromo-9-anthrone, 2-ethyl-9-anthrone, 9,10-anthraquinone, 2-ethyl-9,10-anthraquinone, 2-t-butyl-9,10-anthraquinone, 2,6-dichloro-9,10-anthraquinone, xanthone, 2-methylxanthone, 2-methoxyxanthone, thioxanthone, 2,4-diethylthioxanthone, acridone, 10-butyl-2-chloroacridone, benzyl, dibenzylacetone, p-(dimethylamino)phenylstyryl ketone, p-(dimethylamino)phenyl-p-methylstyryl ketone, benzophenone, p-(dimethylamino)benzophenone (or Michler's ketone), p-(diethylamino)benzophenone, benzoanthrone, benzothiazole-type compounds described in JP-B No. 51-48516, and Tinuvin 1130 and 400.

In the dye-containing curable compositions of the invention, the other known photo-polymerization initiators than the above-mentioned ones may be used.

Specifically, the examples thereof include: vicinal polyketoaldonyl compounds disclosed in U.S. Pat. No. 2,367,660, α-carbonyl compounds disclosed in U.S. Pat. Nos. 2,367,661 and 2,367,670, acyloin ether disclosed in U.S. Pat. No. 2,448,828, aromatic acyloin compounds α-substituted by a hydrocarbon disclosed in U.S. Pat. No. 2,722,512, polynuclear quinone compounds disclosed in U.S. Pat. Nos. 3,046,127 and 2,951,758, a combination of triarylimidazole dimer/p-aminophenyl ketone disclosed in U.S. Pat. No. 3,549,367, and benzothiazole compound/trihalomethylol-s-triazine compound disclosed in JP-B No. 51-48516.

The total amount of the photo-polymerization initiator (and the known initiator) to be used is preferably in 0.01% by mass to 50% by mass, more preferably in 1% by mass to 30% by mass, particularly in 1% by mass to 20% by mass, for the above-mentioned monomer solid component (mass). When the amount to be used is less than 0.01% by mass, polymerization becomes difficult, and when the amount is over 50% by mass, the rate of polymerization is increased but the molecular weight may be decreased to lower the film strength.

<Thermal Polymerization Inhibitors>

In the dye-containing curable compositions of the invention, it is preferred to add a thermal polymerization inhibitor in addition to the above-mentioned components. For example, hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and 2-meracptobenzoimidazole are useful.

<Naphthoquinonediazide Compounds>

When the dye-containing curable composition of the invention is made into a positive type, it may contain a naphthoquinonediazide compound. The examples of the naphthoquinonediazide compound include o-naphthoquinonediazido-5-sulfonic acid ester or sulfonamide, or o-naphthoquinone diazido-4-sulfonic acid ester or sulfonamide. These esters or amides may be produced according to the known method from phenol compounds described as the general formula (I) in JP-A Nos. 2-84650 and 3-49437.

The above-mentioned alkali soluble phenol resin and cross-linking agent may be dissolved in a solvent usually at 2-50% by mass and at 2-30% by mass, respectively, on the basis of the total mass. The above-mentioned naphthoquinone azide compound and dye usually may be added to the solution containing the alkali soluble resin and cross-linking agent at 2-30% by mass and at 2-50% by mass, respectively. In the resist composition for color filter, it is possible to add a variety of additives conventionally used in this technical field, for example, a smoothing agent to give a homogeneously coating effect.

<Solvents>

In preparing the dye-containing curable compositions of the invention, a solvent is used in general. There is no limitation basically in the type of solvents as far as the solubility of the respective components and the coating effect of the dye-containing curable compositions are satisfied. The solvent is preferably selected in consideration of the solubility of dye or binder, coating effect, safety, and so on.

The solvent used includes esters, for example, ethyl acetate, n-butyl acetate, isobutyl acetate, amyl formate, isoamyl acetate, isobutyl acetate, butyl propionate, isopropyl butyrate, ethyl butyrate, butyl butyrate, alkyl esters, methyl lactate, ethyl lactate, methyl oxyacetate, ethyl oxyacetate, butyl oxyacetate, methyl methoxyacetate, ethyl methoxyacetate, butyl methoxyacetate, methyl ethoxyacetate, and ethyl ethoxyacetate;

alkyl 3-oxypropionate such as methyl 3-oxypropionate, ethyl 3-oxypropionate, for example, methyl 3-methoxypropionate, ethyl 3-methoxypropionate, methyl 3-ethoxypropionate, and ethyl 3-ethoxypropionate; alkyl 2-oxypropionate such as methyl 2-oxypropionate, ethyl 2-oxypropionate, propyl 2-oxypropionate, for example, methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate, and ethyl 2-ethoxy-2-methylpropionate; methyl pyruvate, ethyl pyruvate, propyl pyruvate, methyl acetoacetate, ethyl acetoacetate, methyl 2-oxobutanoate, and ethyl 2-oxobutanoate;

ethers, for example, diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol methyl ether, propylene glycol methyl ether acetate, propylene glycol ethyl ether acetate, and propylene glycol propyl ether acetate;

ketones, for examples, methyl ethyl ketone, cyclohexanone, 2-heptanone, and 3-heptanone; and aromatic hydrocarbons, for example, toluene, xylene, and so on.

Among them, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, and propylene glycol methyl ether acetate are particularly preferred.

<A Variety of Additives>

In the dye-containing curable compositions of the invention, if required, it is possible to blend a variety of additives, for example, filler, high molecular compounds other than those as mentioned above, surface active agent, adhesion accelerator, anti-oxidant, ultraviolet absorbent, aggregation inhibitor, and so on.

Specific examples of the additives are: filler such as glass and alumina; high molecular compounds other than adhesive resin such as polyvinyl alcohol, polyacrylic acid, polyethylene glycol monoalkyl ether, and polyfluoroalkyl acrylate; nonionic, cationic or anionic surface active agents; adhesion accelerators such as vinyl trimethoxysilane, vinyl triethoxysilane, vinyl tris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidoxypropyltrimethoxysilane, 3-glycdoxypropylmethyldimethoxysilane, 2-(3,4-epoxycyclohexyl)ethyltrimethoxysilane, 3-chloropropylmethyldimethoxysilane, 3-chloropropyltrimethoxysilane, 3-methacryloxypropyltrimethoxysilane, and 3-mercaptopropyltrimethoxysilane;

anti-oxidants such as 2,2-thiobis(4-methyl-6-t-butylphenol) and 2,6-di-t-butylphenol; ultraviolet absorbents such as 2-(3-t-butyl-5-methyl-2-hydroxyphenyl)-5-chlorobenzotriazole and alkoxybenzophenone; and aggregation inhibitors such as sodium polyacrylate.

In order to promote alkali solubility of the non-image part and further improve the developing properties of the dye-containing curable composition of the invention, it is possible to add an organic carboxylic acid, preferably a low molecular organic carboxylic acid having the molecular weight of less than 1000, to the composition.

Specific examples of the carboxylic acids include aliphatic monocarboxylic acids such as formic acid, acetic acid, propionic acid, butyric acid, valeric acid, pivalic acid, caproic acid, diethylacetic acid, enanthic acid, and capric acid; aliphatic dicarboxylic acids such as oxalic acid, malonic acid, succinic acid, glutaric acid, adipic acid, pimelic acid, suberic acid, azelaic acid, sebacic acid, brassylic acid, methylmalonic acid, ethylmalonic acid, dimethylmalonic acid, methylsuccinic acid, tetramethylsuccinic acid, and citraconic acid; aliphatic tricarboxylic acids such as tricarballylic acid, aconitic acid, and camphoronic acid; aromatic monocarboxylic acids such as benzoic acid, toluic acid, cumic acid, hemellitic acid, mesitylenic acid; aromatic polycarboxylic acids such as phthalic acid, isophthalic acid, terephthalic acid, trimellitic acid, trimesic acid, mellophanic acid, and pyromellitic acid; and other carboxylic acids such as phenylacetic acid, hydroatropic acid, hydrocinnamic acid, mandelic acid, phenylsuccinic acid, atropic acid, cinnamic acid, methyl cinnamate, benzyl cinnamate, cinnamylideneacetic acid, coumaric acid, and umbellic acid.

<Color Filter>

Next, the color filter of the invention will be illustrated in detail through a process of producing it.

In the process of producing the color filter of the invention, the dye-containing curable composition of the invention is employed.

When the dye-containing curable composition of the invention has been made into a negative type, the negative type composition is applied on a support by means of rotational coating, flow coating, or roll coating to form a radiation-sensitive layer of the composition, which is then exposed to light through a certain mask pattern and developed with a developing solution to yield a negative-type color pattern (the image-forming step). In this step, the formed color pattern if required may be cured by heating and/or exposure to light as the curing step.

When the dye-containing curable composition of the invention has been made into a positive type, the positive type composition is applied on a support by means of rotational coating, flow coating, or roll coating to form a radiation-sensitive layer of the composition, which is then exposed to light through a certain mask pattern and developed with a developing solution to yield a positive-type color pattern (the image-forming step). The formed color pattern is then cured by heating (post-baking).

In producing the color filter of the negative type, the above-mentioned image-forming step (and the curing step if necessary) is repeated the number of times required for the desired hue number. In the positive type, the above-mentioned image-forming step and post-baking step are repeated the number of times required for the desired hue number to yield the color filter involving the desired hue.

As the light or radiation used in this process, ultraviolet ray such as g ray, h ray or i ray is preferably used.

The examples of the substrate include those used in a liquid crystal device such as soda glass, Pyrex (R) glass, quartz glass and these materials on which a transparent electrically conductive film is coated, photoelectric conversion device substrate used for image pickup device such as silicone substrate, complimentary metal oxide semiconductor (CMOS), and so on. In some substrates, black stripes are formed thereon to separate the individual pixels.

On these substrates, the under coating may be put for the purpose of improvement of the adhesiveness with the upper coating, prevention of the dispersion of the materials, or the flatness of the substrate surface.

As for the developing solution, it is possible to use any type of solutions in which the uncured parts are dissolved but the irradiated parts not. Specifically, a combination of various organic solvents or an alkaline aqueous solution can be used. Such organic solvents are the same as those used in the preparation of the dye-containing curable composition of the invention.

As for the alkaline aqueous solution, those containing an alkaline compound such as sodium hydroxide, potassium hydroxide, sodium carbonate, sodium silicate, sodium metasilicate, ammonia water, ethylamine, diethylamine, dimethylethanolamine, tetramethylammonium hydroxide, tetraethylammonium hydroxide, choline, pyrrole, piperidine, or 1,8-diazabicyclo-[5.4.0]-7-undecene in a concentration of 0.001-10% by mass, preferably 0.01-1% by mass, are preferably used. When a developing solution comprising an alkaline aqueous solution is used, washing with water is required after the development.

The color filter of the invention can be employed in solid image pickup devices such as liquid crystal device or CCD, particularly preferred in highly resolving CCD elements or CMOS devices having more than a million pixels. In using, the color filter of the invention is placed between a light receiver of the pixels constituting CCD and a micro-lens condensing the light.

The embodiments of the present invention will be described as follows.

The 1st aspect of the invention provides a dye-containing curable composition comprising a binder and a dye that is soluble in an organic solvent wherein the binder contains a structural unit represented by the following general formula (I) and has a glass transition temperature in the range of 0 to 250° C.

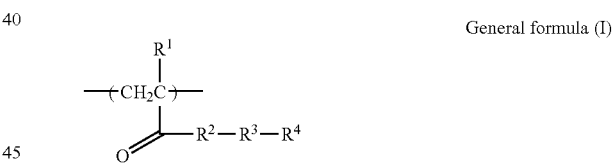

General formula (I)

In the general formula (I), $R^1$ represents a hydrogen atom or a methyl group; $R^2$ represents an oxygen atom, —NH—, or —N($R^3$—$R^4$)—; $R^3$ represents a substituted or unsubstituted divalent group; and $R^4$ represents a group containing an unsaturated double bond.

The 2nd aspect of the invention provides the dye-containing curable composition of the 1st aspect, wherein $R^4$ is selected from the group consisting of vinyl, allyl, (meth)acryloyl, styryl, vinyl ester, and vinyl ether.

The 3rd aspect of the invention provides the dye-containing curable composition of the 1st or 2nd aspects, wherein $R^3$ is one selected from the group consisting of a substituted or unsubstituted alkylene group, a substituted or unsubstituted alkyleneoxy group, and a substituted or unsubstituted ethyloxycarbonylaminoethyl group.

The 4th aspect of the invention provides one of the dye-containing curable compositions of the 1st to 3rd aspects, wherein the binder is water-soluble or alkali-soluble.

The 5th aspect of the invention provides one of the dye-containing curable compositions of the 1st to 4th aspects, wherein a component that is co-polymerized with the structural unit represented by general formula (I) contains no alcoholic hydroxyl group.

The 6th aspect of the invention provides one of the dye-containing curable compositions of the 1st to 5th aspects, wherein the dye that is soluble in an organic solvent contains at least one of an azo-type acidic dye, a xanthene-type acidic dye, an anthraquinone-type acidic dye, a phthalocyanine-type acidic dye, a salt of one of these dyes and a nitrogen-containing compound, and a sulfonamide derivative of one of these dyes.

The 7th aspect of the invention provides a color filter comprising one of the dye-containing curable compositions of the 1st to 6th aspects.

The 8th aspect of the invention provides a process of producing a color filter which comprises the steps of applying, on a support, one of the dye-containing curable compositions of the 1st to 6th aspects, exposing the dye-containing curable composition to light through a mask, and forming a pattern by development. This process may contain, if required, a step of curing the above pattern by heating and/or exposure to light, and this step may be repeated plural times.

The 9th aspect of the invention provides a dye-containing curable composition containing a binder and a dye wherein the binder is a compound represented by the following general formula (II).

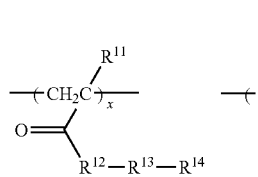

General formula (II)

In the general formula (II), $R^{11}$ represents a hydrogen atom or a methyl group; $R^{12}$ represents an oxygen atom, —NH—, or —N($R^{13}$—$R^{14}$)—; $R^{13}$ represents a substituted or unsubstituted divalent group; and $R^{14}$ represents a group containing an unsaturated double bond. The symbol x indicates a molar fraction of a copolymerizing constituent unit and represents a value that satisfies $0 \leq x \leq 100$.

The 10th aspect of the invention provides the dye-containing curable composition of the 9th aspect, wherein $R^{14}$ is one selected from the group consisting of vinyloxy, allyloxy, (meth)acryloyloxy, 4-vinylphenyloxy, 4-vinylphenylmethyloxy, styryl, vinyl ester, and vinyl ether.

The 11th aspect of the invention provides the dye-containing curable composition of the 9th or 10th aspect, wherein $R^{13}$ is one selected from the group consisting of a substituted or unsubstituted alkylene group, a substituted or unsubstituted alkyleneoxy group, and a substituted or unsubstituted ethyloxycarbonylaminoethyl group.

The 12th aspect of the invention provides one of the dye-containing curable compositions of the 9th to 11th aspects, wherein the binder is water-soluble or alkali-soluble.

The 13th aspect of the invention provides one of the dye-containing curable compositions of the 9th to 12th aspects, wherein the dye is soluble in an organic solvent.

The 14th aspect of the invention provides one of the dye-containing curable composition of the 13th aspect, wherein the dye that is soluble in an organic solvent contains at least one of an azo-type acidic dye, a xanthene-type acidic dye, an anthraquinone-type acidic dye, a phthalocyanine-type acidic dye, a salt of one of these dyes and a nitrogen-containing compound, and a sulfonamide derivative of one of these dyes.

The 15th aspect of the invention provides a color filter comprising one of the dye-containing curable compositions of the 9th to 14th aspects.

The 16th aspect of the invention provides a process of producing a color filter which comprises the steps of applying, on a support, one of the dye-containing curable compositions of the 9th to 14th aspects, exposing the dye-containing curable composition to light through a mask, and forming a pattern by development.

In the process of producing the color filter, the above-mentioned step is repeated the number of times required for the desired hue number in order to obtain a color filter having the desired hue. If required, a step of curing the above pattern by heating and/or exposure to light may be involved as an embodiment.

EXAMPLES

The present invention will be explained specifically by the following examples which are not intended as a limitation thereof as far as they are within the scope of the invention. The term "part" means part by mass unless indicated otherwise.

Example A1

(1) Preparation of a Dye-containing Curable Composition (Dye-containing Resist Solution)

| | |
|---|---|
| Ethyl lactate | 70.27 parts |
| Compound of Specific Example I-1 | 4.77 parts |
| (Binder of the 1st embodiment) | |
| Dipentaerythritol hexaacrylate | 7.16 parts |
| Polymerization inhibitor | 0.0036 part |
| (p-Methoxyphenol) | |
| Fluorine surfactant ethyl lactate solution | 4.17 parts |
| Photo-polymerization initiator | 2.06 parts |
| TAZ-107 (Midori Kagaku) | |
| Acid yellow 42 bis(ditolylguanidine)salt | 6.00 parts |

The above components were mixed and dissolved to give a dye-containing curable composition (dye-containing resist solution).

(2) Preparation of an Under-coating Glass Substrate

A glass substrate (Corning 1737) was ultra-sonicated with 1% NaOH-water, then washed with water and baked for drying (200° C./30 min).

A solution of CT-2000L (Fuji Film Arch) was then applied on the washed glass substrate by a spin coater so that the film thickness was 2 μm, and dried under heating at 220° C. for 1 hour to give an under-coating glass substrate.

(3) Exposure and Development of the Dye-containing Curable Composition (Dye Resist) (Image Formation)

The dye-containing curable composition (dye-containing resist solution) prepared in the above item (1) was applied on the under-coating layer of the glass substrate prepared in the above item (2) by a spin coater so that the film thickness was 1 μm, and then pre-baked at 120° C. for 120 seconds.

Next, the coating film was irradiated with an exposure value of 1000 mJ/cm² by an i ray reduced exposure projector at a wavelength of 365 nm through a 2 μm island pattern mask. Following the exposure, the pattern was developed with 60% CD-2000 (Fuji Film Arch) developing solution at 26° C. for 90 seconds. Subsequently, the substrate was rinsed with running water for 20 seconds and spray-dried. Image formation and the shape of pattern were observed by a conventional way using an optical microscope and SEM photograph.

(4) Evaluation (4-1) Thermal Resistance

The thermal resistance of the pattern formed was evaluated by heating the developed pattern at 200° C. for 10 minutes and observing the change of the pattern shape visually by SEM photograph. Evaluation was made according to the following criteria. The pattern smaller in change of the shape is better in thermal resistance.

[Criteria]

oo: No change or almost no change was observed.

O: The width change of the lower edge of the pattern before and after heating was less than 10%.

x: The width change of the lower edge of the pattern before and after heating was 10% or more.

(4-2) Developing Properties in the Unexposed Parts and the Film Residual Rate in the Exposed Parts The developing properties in the unexposed parts and the film residual rate in the exposed parts were measured by a chromaticity meter MCPD-1000 (Otsuka Denshi). The developing properties in the unexposed parts and the residual rate in the exposed parts indicate the maintenance rate of the absorbance before and after development. In the unexposed parts, the smaller value indicates better in the developing properties, and in the exposed parts, the larger value does better in the film residual rate.

Table 1 indicates the results of the above evaluation.

Examples A2 to A7

In preparing the dye-containing curable composition (dye-containing resist solution) of Example A1(1), a variety of binders as shown in Table 1 were employed in place of the binder of the compound (I-1) (the binder of the invention). Otherwise, the preparation of the composition was carried out in the same manner as in Example A1. The pattern image was again formed and evaluated in the same manner.

Comparative Example A1

In preparing the dye-containing curable composition (dye-containing resist solution) of Example A 1(1), (benzyl methacrylate)-(methacrylic acid)-(2-hydroxyethylmethacrylate) copolymer (molar ratio=60:20:20) was employed in place of the binder of the compound (I-1) (the binder of the first embodiment of the invention). Otherwise, the preparation of the composition was carried out in the same manner as in Example A1. The pattern image was again formed and evaluated in the same manner.

Comparative Example A2

In preparing the dye-containing curable composition (dye-containing resist solution) of Example A1 (1), (benzyl methacrylate)-(methacrylic acid) copolymer (molar ratio=60:40) was employed in place of the binder of the compound (I-1) (the binder of the invention). Otherwise, the preparation of the composition was carried out in the same manner as in Example A1. The pattern image was again formed and evaluated in the same manner.

TABLE 1

| Example No. | Binder used | Mol. Wt. of Binder (Mw) | DPUE* (%) | RRFE** (%) | Therm. Resist. (200° C./10 min) | Binder Tg (° C.) |
|---|---|---|---|---|---|---|
| A1 | Compound (I-1) | 17000 | 0 | 98 | oo | 120 |
| A2 | Compound (I-2) | 19000 | 0 | 97 | oo | 130 |
| A3 | Compound (I-3) | 16000 | 0 | 98 | oo | 140 |
| A4 | Compound (I-4) | 18000 | 0 | 95 | O | 140 |
| A5 | Compound (I-5) | 17000 | 0 | 99 | oo | 160 |
| A6 | Compound (I-14) | 21000 | 0 | 97 | O | 130 |
| A7 | Compound (I-15) | 17000 | 0 | 99 | oo | 160 |
| Cmp. Ex. A1 | BnMA60-HEMA20-MAA20 | 16000 | 45 | 75 | x | 80 |
| Cmp. Ex. A2 | BnMA60-MAA40 | 17000 | 40 | 60 | x | 100 |

*Developing properties in the unexposed parts
**Residual rate of the film in the exposed parts As shown in Table 1, it was possible to prepare the dye-containing curable compositions much better than the known compositions in the developing properties in the unexposed parts, the film residual rate in the exposed parts and the thermal resistance of the pattern shape by using the binder of the invention. Thus, the binder of the invention is apparently useful as a dye-containing curable composition used in a variety of color filters since it allows attainment of sufficient copolymerization, hardness and thermal resistance, as well as better performance in the developing properties in the unexposed parts and the film residual rate in the exposed-parts. In addition, when the yellow dye used in the dye-containing curable composition was replaced by another color as a second color, much better dye elution during the coating and color mixture were observed.

On the other hand, as shown in Comparative Examples A1 and A2, when the binders disclosed in Comparative Examples are used, the formed pattern is far inferior to the above ones in the developing properties in the unexposed parts, the film residual rate in the exposed parts, and the thermal resistance of pattern shape, since (1) they are poor in cross-linking ability for lack of any polymerization group and (2) they are unbalanced in hydrophilicity and their interaction with the dye is not adjusted, apparently indicating that they are practically unemployable resists.

In addition, since the Tg value of the binder in Comparative Examples are not quite different from that of Examples, it is suggested that the effect of the polymerization group would be great.

Examples A8 to A14

In place of the glass substrate, a silicone wafer substrate was used. Otherwise, the same operation was made as in Example A1 to give a pattern image. The developing proper ties in the unexposed parts and the residual rate of the film in the exposed parts were the same as in Examples A1 to A7.

Though a silicone wafer substrate was used in Examples A8 to A14 different from Examples A1 to A7, the dye-containing resist solution was applied on the under-layer in all cases throughout Examples A1 to A14, and so it made practically no difference to give the same performance.

preparation of the composition was carried out in the same manner as in Example A1. Table 2 shows the results.

In Table 2, "MOEMA" represents methacryloyloxyethyl methacrylate.

TABLE 2

| Example No. | Binder used | Mol. Wt. of Binder (Mw) | DPUE* (%) | RRFE** (%) | Therm. Resist. (200° C./10 min) | Binder Tg (° C.) |
|---|---|---|---|---|---|---|
| Cmp. Ex. A3 | BuA60-HEMA20-MAA20 | 13000 | 30 | 50 | xx | −20 |
| Cmp. Ex. A4 | MOEMA20-HEMA20-BA40-AA20 | 12000 | 40 | 60 | xx | −10 |

*Developing properties in the unexposed parts
**Residual rate of the film in the exposed parts
xx: The width change of the lower edge of the pattern before and after heating was 20% or more.

Example A15

In preparing the dye-containing curable composition (dye-containing resist solution) of Example A1 (1), "Valifast Red-1360 (Orient Chemical)" was used in place of "Acid yellow 42 bis(ditolylguanidine) salt". Otherwise, the same operation was made to give a pattern image. The developing properties in the unexposed parts and the film residual rate in the exposed parts were the same as in Example A1.

Example A16

In preparing the dye-containing curable composition (dye-containing resist solution) of Example A1 (1), "Valifast Blue-2620 (Orient Chemical)" was used in place of "Acid yellow 42 bis(ditolylguanidine) salt". Otherwise, the same operation was made to give a pattern image. The developing properties in the unexposed parts and the film residual rate in the exposed parts were the same as in Example A1.

Example A 17

In preparing the dye-containing curable composition (dye-containing resist solution) of Example A1 (1), "2,7-Naphthalenedisulfonic acid, 3-[(5-chloro-2-phenoxyphenyl) hydrazono]-3,4-dihydro-4-oxo-5-[(phenylsulfonyl)amino]-, ditolylguanidine salt" was used in place of "Acid yellow 42 bis(ditolylguanidine) salt". Otherwise, the same operation was made to as in Example A1 give a pattern image.

The developing properties in the unexposed parts and the film residual rate in the exposed parts were the same as in Example A1.

Comparative Example A3

In preparing the dye-containing curable composition (dye-containing resist solution) of Example A1 (1), (butyl acrylate)-(2-hydroxyethylmethacrylate)-(acrylic acid) copolymer (molar ratio=60:20:20; molecular weight Mw=13000) was employed as a binder. Otherwise, the preparation of the composition was carried out in the same manner as in Example A1. Table 2 shows the results.

Comparative Example A4

In preparing the dye-containing curable composition (dye-containing resist solution) of Example A1 (1), (methacryloyloxyethyl methacrylate)-(2-hydroxyethylmethacrylate)-(butyl acrylate)-(acrylic acid) copolymer (molar ratio=20:20:40:20; Mw=12000) was employed as a binder. Otherwise, the As shown in Comparative Example A3, when the binder disclosed in Comparative Example A3 is used, the formed pattern is far inferior to the above ones in the developing properties in the unexposed parts, the residual rate of the film in the exposed parts, and the thermal resistance of pattern shape, since (1) it is poor in cross-linking ability for lack of any polymerization group, (2) it is unbalanced in hydrophilicity and its interaction with the dye is not adjusted, and (3) Tg is very low, apparently indicating that it is practically unemployable resist.

Additionally, as shown in Comparative Example A4, when the binder disclosed in Comparative Example A4 is used, the formed pattern is far inferior to the above ones in the developing properties in the unexposed, the residual rate of the film in the exposed parts, and the thermal resistance of pattern shape, though it has polymerization groups, since (1) it is unbalanced in hydrophilicity and the interaction with the dye is not adjusted, and (2) Tg is very low, apparently indicating that it is practically unemployable resist.

Example B1

(1) Preparation of a Dye-containing Curable Composition (Dye-containing Resist Solution)

| | |
|---|---|
| Ethyl lactate | 70.27 parts |
| Compound (II-1) | 4.77 parts |
| (Binder of formula (II) in the 2nd embodiment) | |
| Dipentaerythritol hexaacrylate | 7.16 parts |
| Polymerization inhibitor | 0.0036 part |
| (p-Methoxyphenol) | |
| Fluorine surfactant ethyl lactate solution | 4.17 parts |
| (F-475 Dainippon Ink and Chemicals, Inc.) | |
| Photo-polymerization initiator | 2.06 parts |
| TAZ-107 (Midori Kagaku) | |
| Acid yellow 42 bis(ditolylguanidine)salt | 6.00 parts |

The above components were mixed and dissolved to give a dye-containing curable composition (dye-containing resist solution).

(2) Preparation of an Under-coating Glass Substrate

In the same manner as in Example A1 (2), an under-coating glass substrate was prepared.

(3) Exposure and Development of the Dye-containing Curable Composition (Dye Resist) (Image Formation)

The dye-containing curable composition (dye-containing resist solution) prepared in the above item (1) was applied on the under-coating layer of the glass substrate prepared in the above item (2) by a spin coater so that the film thickness was 1 μm, and then pre-baked at 120° C. for 120 seconds.

Next, the coating film was irradiated with an exposure value of 1000 mJ/cm² by an i ray reduced exposure projector at a wavelength of 365 nm through a 2 μm island pattern mask. Following the exposure, the pattern was developed with 60% CD-2000 (Fuji Film Arch) developing solution at 26° C. for 90 seconds. Subsequently, the substrate was rinsed with running water for 20 seconds and spray-dried to give an yellow pattern image. Image formation was observed by a conventional way using an optical microscope and SEM photograph.

(4) Evaluation (4-1) Thermal Resistance

Thermal resistance of the formed pattern was evaluated in the same manner as in Example A1.

(4-2) Developing Properties in the Unexposed Parts and the Film Residual Rate in the Exposed Parts The developing properties in the unexposed parts and the film residual rate in the exposed parts were evaluated in the same manner as in Example A1. The results of evaluation are shown in Table 3.

(4-3) In place of the yellow dye used in preparation of the dye-containing curable composition in the above item (1), another color was applied as a second color, and dye elution during the coating and color mixture were observed to evaluate the change of the absorbance before and after the image formation of the second color.

Examples B2 to B7 and Comparative Examples B1 to B2

In preparing the dye-containing curable composition (dye-containing resist solution) of Example B1, a variety of binders as shown in Table 3 were employed in place of the binder of the compound (II-1) (the binder of the general formula (II)). Otherwise, the preparation of the composition was carried out in the same manner as in Example B1. The pattern image was again formed and evaluated in the same manner.

TABLE 3

| Example | Binder Species | Mol. Wt. (Mw) | DPUE* | RRFE** (%) | Therm. Resist. (200° C./ 10 min) |
|---|---|---|---|---|---|
| B1 | Compound (II-1)*¹ | 16000 | 0 | 95 | ○○ |
| B2 | Compound (II-2)*¹ | 18000 | 0 | 92 | ○ |
| B3 | Compound (II-3)*¹ | 15000 | 0 | 97 | ○○ |
| B4 | Compound (II-4)*¹ | 19000 | 0 | 92 | ○ |
| B5 | Compound (II-5)*¹ | 18000 | 0 | 95 | ○○ |
| B6 | Compound (II-16)*¹ | 19000 | 0 | 93 | ○○ |
| B7 | Compound (II-19)*¹ | 18000 | 0 | 92 | ○ |
| Cmp. Ex. B1 | BnMA60-HEMA20-MAA20*² | 16000 | 45 | 75 | x |
| Cmp. Ex. B2 | BnMA60-MAA40*³ | 17000 | 40 | 60 | x |

*Developing properties in the unexposed parts
**Residual rate of the film in the exposed parts
*¹Compound represented by the formula (II) (binder)
*²Benzyl methacrylate-methacrylic acid-2-hydroxyethyl methacrylate copolymer [60:20:20 (molar ratio)]
*³Benzyl methacrylate-methacrylic acid copolymer [60:40 (molar ratio)]

As shown in Table 3, Examples B1 to B7, incorporation of the compounds of the general formula (II) into the binder resulted in excellent polymerization curing to form a highly thermally resisting pixel pattern in high efficiency (high productivity). In addition, the developing properties in the unexposed parts and the film residual rate in the exposed parts were satisfactory. Thus, the resulting color filter has high hardness, high resolving power and broad developing latitude, in which the color mixture was suppressed and the hue and transmittance were satisfactory. That is, the dye-containing curable compositions are apparently useful as binders for use in a variety of color filters.

On the other hand, when the binders disclosed in Comparative Examples B1 and B2 are used, the pixel pattern is far inferior to the above ones in the developing properties in the unhardened parts, the film residual rate in the cured parts, and the thermal resistance of the pixel pattern, since they are poor in cross-linking ability for lack of any polymerization group and they are unbalanced in hydrophilicity and their interaction with the dye is not adjusted, apparently indicating that they are practically unemployable resists.

Examples B8 to B14

In place of the glass substrate used in Examples B1 to B7, a silicone wafer substrate was used. Otherwise, the operation was made in the same manner as in Examples B1 to B7 to give a pattern image. The results in the thermal resistance as well as in the developing properties in the unexposed parts and the film residual rate of the exposed parts were the same as in Examples B1 to B7.

Though a silicone wafer substrate was used in Examples B8 to B14 different from Examples B1 to B7, the dye-containing curable composition (dye-containing resist solution) was applied on the under-layer in all cases throughout Examples B1 to B14, and so it makes practically no difference to give the same performance.

The dye-containing curable compositions soluble in solvents, since they give high polymerization properties and high thermal resistance of the pattern, allow high sensitivity, high transparency and high resolution, have broad developing latitude, and show no dye elution, color mixture, heat deterioration and light deterioration. Thus, the present invention provides highly solvent-soluble dye-containing curable compositions and color filters using the same.

In particular, the purpose of the invention is to provide high thermal resistance to the pattern.

By using the highly solvent-soluble dye-containing curable compositions, it is possible to provide color filters conveniently in high cost performance and a process of producing the same.

What is claimed is:

1. A color filter comprising a dye-containing curable composition containing a binder and a dye that is soluble in an organic solvent, wherein the binder contains a structural unit represented by the following general formula (I) and has a glass General formula (I)

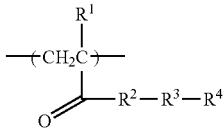

transition temperature in a range of 0 to 250° C., wherein $R^1$ represents a hydrogen atom or a methyl group; $R^2$ represents an oxygen atom, —NH—, or —N($R^3$—$R^4$)—; $R^3$ represents a substituted or unsubstituted divalent group; and $R^4$ is selected from the group consisting of vinyloxy, allyloxy and (meth)acryloyloxy.

2. The color filter according to claim 1, wherein the dye is selected from the group consisting of an azo-type acidic dye, a xanthene-type acidic dye, an anthraquinone-type acidic dye, a phthalocyanine-type acidic dye, a salt of one of these dyes and a nitrogen-containing compound, and a sulfonamide derivative of one of these dyes.

3. A process of producing a color filter, the process comprising the steps of:
applying, on a support, a dye-containing curable composition containing a binder and a dye that is soluble in an organic solvent;
exposing the dye-containing curable composition to light through a mask; and
forming a pattern by development,
wherein the binder contains a structural unit represented by the following general formula (I) and has a glass transition temperature in a range of 0 to 250° C., General formula (I)

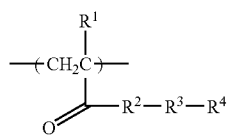

wherein $R^1$ represents a hydrogen atom or a methyl group; $R^2$ represents an oxygen atom, —NH—, or —N($R^3$—$R^4$)—; $R^3$ represents a substituted or unsubstituted divalent group; and $R^4$ is selected from the group consisting of vinyloxy, allyloxy and (meth)acryloyloxy.

4. The process of producing a color filter according to claim 3, wherein the dye is selected from the group consisting of an azo-type acidic dye, a xanthene-type acidic dye, an anthraquinone-type acidic dye, a phthalocyanine-type acidic dye, a salt of one of these dyes and a nitrogen-containing compound, and a sulfonamide derivative of one of these dyes.

5. A color filter comprising a dye-containing curable composition containing a binder and a dye, wherein the binder is a compound represented by the following general formula (II), General formula (II)

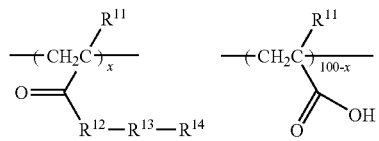

wherein $R^{11}$ represents a hydrogen atom or a methyl group; $R^{12}$ represents an oxygen atom, —NH—, or —N($R^{13}$—$R^{14}$)—; $R^3$ represents a substituted or unsubstituted divalent group; $R^{14}$ is selected from the group consisting of vinyloxy, allyloxy and (meth)acryloyloxy; and x indicates a molar fraction of a copolymerizing constituent unit and represents a value that satisfies 0<x<100.

6. The color filter according to claim 5, wherein the dye is selected from the group consisting of an azo-type acidic dye, a xanthene-type acidic dye, an anthraquinone-type acidic dye, a phthalocyanine-type acidic dye, a salt of one of these dyes and a nitrogen-containing compound, and a sulfonamide derivative of one of these dyes.

7. A process of producing a color filter, the process comprising the steps of:
applying, on a support, a dye-containing curable composition containing a binder and a dye;
exposing the dye-containing curable composition to light through a mask; and
forming a pattern by development,
wherein the binder is a compound represented by the following general formula (II), General formula (II)

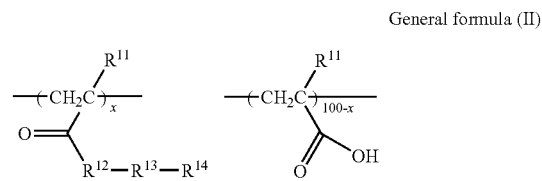

wherein $R^{11}$ represents a hydrogen atom or a methyl group; $R^{12}$ represents an oxygen atom, —NH—, or —N($R^{13}$—$R^{14}$)—; $R^{13}$ represents a substituted or unsubstituted divalent group; $R^{14}$ is selected from the group consisting of vinyloxy, allyloxy and (meth)acryloyloxy; and x indicates a molar fraction of a copolymerizing constituent unit and represents a value that satisfies 0<x<100.

8. The process of producing a color filter according to claim 7, wherein the dye is selected from the group consisting of an azo-type acidic dye, a xanthene-type acidic dye, an anthraquinone-type acidic dye, a phthalocyanine-type acidic dye, a salt of one of these dyes and a nitrogen-containing compound, and a sulfonamide derivative of one of these dyes.

* * * * *